United States Patent
Yang et al.

(10) Patent No.: US 12,237,774 B2
(45) Date of Patent: Feb. 25, 2025

(54) SYSTEMS AND METHODS FOR POWER DETECTION USING AT LEAST A PULSE-WIDTH-MODULATION SIGNAL

(71) Applicant: ON-BRIGHT ELECTRONICS (SHANGHAI) CO., LTD., Shanghai (CN)

(72) Inventors: Penglin Yang, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 87 days.

(21) Appl. No.: 17/897,848

(22) Filed: Aug. 29, 2022

(65) Prior Publication Data
US 2023/0070846 A1 Mar. 9, 2023

(30) Foreign Application Priority Data
Jul. 29, 2021 (CN) .......................... 202110867161.0

(51) Int. Cl.
*H02M 3/335* (2006.01)
*H02M 1/00* (2007.01)

(52) U.S. Cl.
CPC ..... *H02M 3/33515* (2013.01); *H02M 1/0009* (2021.05); *H02M 1/0087* (2021.05)

(58) Field of Classification Search
CPC ....................... H02M 3/33569; H02M 3/33515
See application file for complete search history.

(56) References Cited

U.S. PATENT DOCUMENTS

| | | | |
|---|---|---|---|
| 4,182,983 A | 1/1980 | Heinrich et al. | |
| 10,852,330 B1 | 12/2020 | Truong et al. | |
| 2008/0316779 A1 | 12/2008 | Jayaraman et al. | |

(Continued)

FOREIGN PATENT DOCUMENTS

| CN | 1067744 A | * | 1/1993 |
|---|---|---|---|
| CN | 1100811 A | * | 3/1995 |

(Continued)

OTHER PUBLICATIONS

Office action received from Chinese patent application No. 202110867161.0 mailed on Nov. 29, 2023, 12 pages (5 pages English Translation and 7 pages Original Copy).

(Continued)

*Primary Examiner* — Sisay G Tiku
(74) *Attorney, Agent, or Firm* — Faegre Drinker Biddle & Reath LLP

(57) ABSTRACT

System and method for detecting a power. For example, a system for detecting a power includes: a first signal converter configured to receive a first signal and generate a pulse-width-modulation signal based at least in part on the first signal; a second signal converter configured to receive a second signal and generate a voltage signal based at least in part on the second signal; and a low-pass filter configured to receive the pulse-width-modulation signal and the voltage signal and generate a power detection signal based at least in part on the pulse-width-modulation signal and the voltage signal; wherein: the first signal is either an input current or an input voltage; the second signal is either the input current or the input voltage; and the first signal and the second signal are different.

21 Claims, 17 Drawing Sheets

(56) References Cited

U.S. PATENT DOCUMENTS

| | | | | |
|---|---|---|---|---|
| 2012/0146607 A1* | 6/2012 | Kung | ............... | H02M 3/33523 323/283 |
| 2013/0258723 A1* | 10/2013 | Fang | ................ | H02M 3/33523 363/21.17 |
| 2015/0280612 A1* | 10/2015 | Ide | ..................... | H02M 7/5395 363/98 |
| 2016/0065080 A1 | 3/2016 | Pastrana et al. | | |
| 2017/0168550 A1 | 6/2017 | Lu et al. | | |
| 2018/0100881 A1 | 4/2018 | Liu | | |
| 2019/0348919 A1* | 11/2019 | Fang | ....................... | H02M 1/12 |
| 2020/0052586 A1 | 2/2020 | Price et al. | | |
| 2021/0067027 A1* | 3/2021 | Liu | ......................... | H02M 7/06 |
| 2023/0291315 A1* | 9/2023 | Yang | ....................... | H02M 1/38 |
| 2023/0396142 A1* | 12/2023 | Jung | .................. | H02M 3/1582 |

FOREIGN PATENT DOCUMENTS

| | | |
|---|---|---|
| CN | 102362189 A | 2/2012 |
| CN | 110501563 A | 11/2019 |
| CN | 110501566 A | 11/2019 |
| CN | 112946359 A | 6/2021 |
| DE | 19720214 A1 | 11/1997 |
| FI | 832961 A | 2/1985 |
| TW | 200732672 A | 9/2007 |
| TW | 200923377 A | 6/2009 |

OTHER PUBLICATIONS

Taiwan Intellectual Property Office, Office Action mailed Jul. 7, 2022, in Application No. 110142624.

Li et al., "Development of a PWM Power Amplifier and Its Application," Microelectronics in 2007, vol. 37, No. 4, pp. 584-587 (Aug. 2007).

Liu et al., "Design of the High Efficiency Audio Power Amplifier," Research and Exploration in Laboratory in 2011, vol. 30, No. 8, pp. 103-107 (Aug. 2011).

* cited by examiner

SYSTEMS AND METHODS FOR POWER DETECTION USING AT LEAST A PULSE-WIDTH-MODULATION SIGNAL

1. CROSS-REFERENCES TO RELATED APPLICATIONS

This application claims priority to Chinese Patent Application No. 202110867161.0, filed Jul. 29, 2021, incorporated by reference herein for all purposes.

2. BACKGROUND OF THE INVENTION

Certain embodiments of the present invention are directed to circuits. More particularly, some embodiments of the invention provide systems and methods for power detection. Merely by way of example, some embodiments of the invention have been applied to flyback power converters. But it would be recognized that the invention has a much broader range of applicability.

A conventional system for power detection often receives a voltage signal and a current signal separately and then uses an analog multiplier to multiply the voltage signal and the current signal to determine the detected power. FIG. 1 is a simplified diagram showing a conventional power detector. The power detector 100 includes an analog multiplier 190. The analog multiplier 190 receives a voltage signal 111 and a current signal 121 and generates a power detection signal 131 that is equal to the voltage signal 111 multiplied by the current signal 121. The conventional power detector often uses a complex circuit design, provides a small range of linearity, and/or suffers from high noise and poor temperature stability.

Hence it is highly desirable to improve the technique for power detection.

3. BRIEF SUMMARY OF THE INVENTION

Certain embodiments of the present invention are directed to circuits. More particularly, some embodiments of the invention provide systems and methods for power detection. Merely by way of example, some embodiments of the invention have been applied to flyback power converters. But it would be recognized that the invention has a much broader range of applicability.

According to certain embodiments, a system for detecting a power includes: a first signal converter configured to receive a first signal and generate a pulse-width-modulation signal based at least in part on the first signal; a second signal converter configured to receive a second signal and generate a voltage signal based at least in part on the second signal; and a low-pass filter configured to receive the pulse-width-modulation signal and the voltage signal and generate a power detection signal based at least in part on the pulse-width-modulation signal and the voltage signal; wherein: the first signal is either an input current or an input voltage; the second signal is either the input current or the input voltage; and the first signal and the second signal are different; wherein: the power detection signal represents an input power that is equal to the input current multiplied by the input voltage; and the power detection signal changes linearly with the input power in magnitude.

According to some embodiments, a system for detecting a power includes: a first signal converter configured to receive a first signal and generate a logic signal based at least in part on the first signal; a second signal converter configured to receive a second signal and generate a current signal based at least in part on the second signal; and a signal generator configured to receive the logic signal and the current signal and generate a power detection signal based at least in part on the logic signal and the current signal; wherein: the first signal is either an input current or an input voltage; the second signal is either the input current or the input voltage; and the first signal and the second signal are different; wherein: the power detection signal represents an input power that is equal to the input current multiplied by the input voltage; and the power detection signal changes linearly with the input power in magnitude.

According to certain embodiments, a method for detecting a power includes: receiving a first signal; generating a pulse-width-modulation signal based at least in part on the first signal; receiving a second signal; generating a voltage signal based at least in part on the second signal; receiving the pulse-width-modulation signal and the voltage signal; and generating a power detection signal based at least in part on the pulse-width-modulation signal and the voltage signal, the power detection signal being equal to the voltage signal multiplied by a duty cycle of the pulse-width-modulation signal; wherein: the first signal is either an input current or an input voltage; the second signal is either the input current or the input voltage; and the first signal and the second signal are different; wherein: the power detection signal represents an input power that is equal to the input current multiplied by the input voltage; and the power detection signal changes linearly with the input power in magnitude.

According to some embodiments, a method for detecting a power includes: receiving a first signal; generating a logic signal based at least in part on the first signal; receiving a second signal; and generating a current signal based at least in part on the second signal; receiving the logic signal and the current signal; and generating a power detection signal based at least in part on the logic signal and the current signal, the power detection signal being equal to the current signal multiplied by a pulse width of the logic signal and also multiplied by a predetermined constant; wherein: the first signal is either an input current or an input voltage; the second signal is either the input current or the input voltage; and the first signal and the second signal are different; wherein: the power detection signal represents an input power that is equal to the input current multiplied by the input voltage; and the power detection signal changes linearly with the input power in magnitude.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

Certain embodiments of the present invention are directed to circuits. More particularly, some embodiments of the invention provide systems and methods for power detection. Merely by way of example, some embodiments of the invention have been applied to flyback power converters. But it would be recognized that the invention has a much broader range of applicability.

Figure 1:
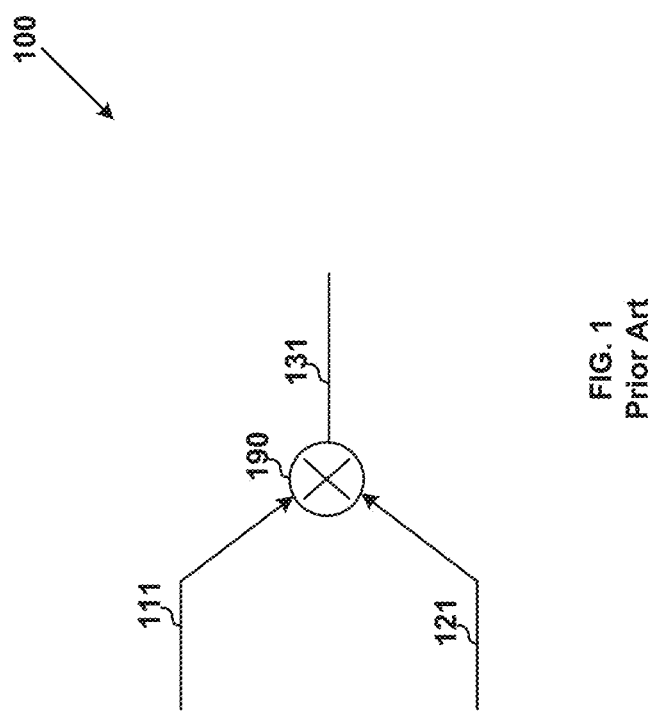
FIG. 1 is a simplified diagram showing a conventional power detector.
Figure 2:
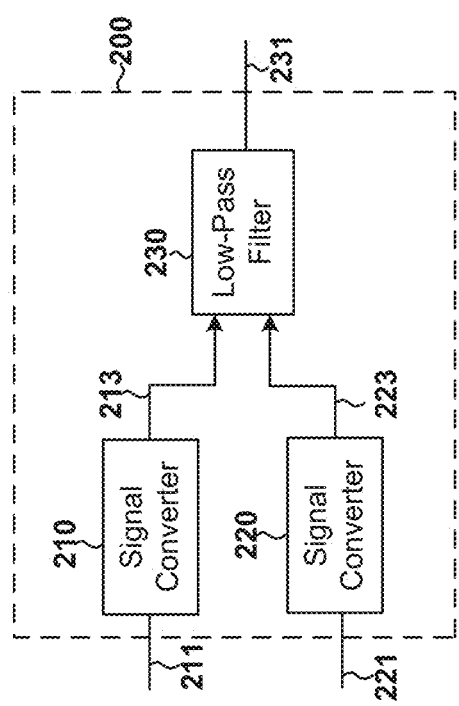
FIG. 2 is a simplified diagram showing a power detector according to certain embodiments of the present invention.

FIG. 2 is a simplified diagram showing a power detector according to certain embodiments of the present invention. This diagram is merely an example, which should not unduly limit the scope of the claims. One of ordinary skill in the art would recognize many variations, alternatives, and modifications. As shown in FIG. 2, the power detector 200 includes a signal converter 210, a signal converter 220, and a low-pass filter 230. Although the above has been shown using a selected group of components for the power detector 200, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

According to some embodiments, the signal converter 210 receives an input signal 211 and converts the input signal 211 to a pulse-width-modulation signal 213, and the signal converter 220 receives an input signal 221 and converts the input signal 221 to a voltage signal 223. For example, the pulse-width-modulation signal 213 is a voltage signal. As an example, the pulse-width-modulation signal 213 is a logic signal, which has a logic high level corresponding to a high voltage value and also has a logic low level corresponding to a low voltage value. In certain examples, the frequency of the pulse-width-modulation signal 213 remains constant, regardless of whether the duty cycle of the pulse-width-modulation signal 213 changes or not. For example, even if the duty cycle of the pulse-width-modulation signal 213 changes, the frequency of the pulse-width-modulation signal 213 remains constant. As an example, even if the duty cycle of the pulse-width-modulation signal 213 changes, the period of the pulse-width-modulation signal 213 remains constant.

In some examples, the duty cycle of the pulse-width-modulation signal 213 changes linearly with the magnitude of the input signal 211. For example, the duty cycle of the pulse-width-modulation signal 213 increases linearly with the increasing magnitude of the input signal 211. As an example, the duty cycle of the pulse-width-modulation signal 213 decreases linearly with the decreasing magnitude of the input signal 211. In certain examples, the magnitude of the voltage signal 223 changes linearly with the magnitude of the input signal 221. For example, the magnitude of the voltage signal 223 increases linearly with the increasing magnitude of the input signal 221. As an example, the magnitude of the voltage signal 223 decreases linearly with the decreasing magnitude of the input signal 221.

In certain embodiments, if the input signal 211 is an input voltage, the input signal 221 is an input current, and if the input signal 211 is an input current, the input signal 221 is an input voltage. For example, the input power is equal to the input voltage multiplied by the input current. As an example, the input power is equal to the input signal 211 multiplied by the input signal 221. In some embodiments, the low-pass filter 230 (e.g., a signal generator) receives the pulse-width-modulation signal 213 and the voltage signal 223 and generates a power detection signal 231. For example, the power detection signal 231 is a voltage signal. In certain examples, the power detection signal 231 represents the input power. In some examples, the power detection signal 231 changes linearly with the input power. For example, the power detection signal 231 increases linearly with the increasing input power. As an example, the power detection signal 231 decreases linearly with the decreasing input power.

Figure 3A:
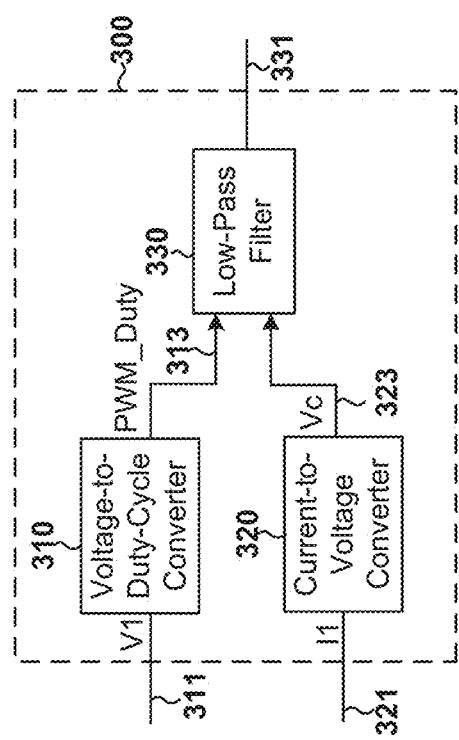
FIG. 3A is a simplified diagram showing a power detector according to certain embodiments of the present invention.

FIG. 3A is a simplified diagram showing a power detector according to certain embodiments of the present invention. This diagram is merely an example, which should not unduly limit the scope of the claims. One of ordinary skill in the art would recognize many variations, alternatives, and modifications. As shown in FIG. 3A, the power detector 300 includes a voltage-to-duty-cycle converter 310, a current-to-voltage converter 320, and a low-pass filter 330. Although the above has been shown using a selected group of components for the power detector 300, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

According to some embodiments, the voltage-to-duty-cycle converter 310 receives an input voltage 311 (e.g., V1) and converts the input voltage 311 (e.g., V1) to a pulse-width-modulation signal 313, and the current-to-voltage converter 320 receives an input current 321 (e.g., I1) and converts the input current 321 (e.g., I1) to a voltage signal 323 (e.g., Vc). For example, the pulse-width-modulation signal 313 is a voltage signal (e.g., PWM_Duty). As an example, the pulse-width-modulation signal 313 is a logic signal, which has a logic high level corresponding to a high voltage value and also has a logic low level corresponding to a low voltage value.

In certain examples, the current-to-voltage converter 320 includes one or more resistors, which convert the input current 321 (e.g., I1) to the voltage signal 323 (e.g., Vc). For example, the voltage signal 323 is determined as follows:

$$V_c = I_1 \times R_x \quad \text{(Equation 1)}$$

where $V_c$ represents the voltage signal 323. Additionally, $I_1$ represents the input current 321, and $R_x$ represents the resistance of the resistor that converts the input current 321 to the voltage signal 323 according to some embodiments.

In some examples, the duty cycle of the pulse-width-modulation signal 313 changes linearly with the magnitude of the input voltage 311 (e.g., V1). For example, the duty cycle of the pulse-width-modulation signal 313 increases linearly with the increasing magnitude of the input voltage 311 (e.g., V1). As an example, the duty cycle of the pulse-width-modulation signal 313 decreases linearly with the decreasing magnitude of the input voltage 311 (e.g., V1).

In certain examples, the magnitude of the voltage signal 323 changes linearly with the magnitude of the input current 321 (e.g., I1). For example, the magnitude of the voltage signal 323 increases linearly with the increasing magnitude of the input current 321 (e.g., I1). As an example, the magnitude of the voltage signal 323 decreases linearly with the decreasing magnitude of the input current 321 (e.g., I1).

In certain embodiments, the input voltage 311 (e.g., V1) multiplied by the input current 321 (e.g., It) is equal to the input power. In some embodiments, the low-pass filter 330 receives the pulse-width-modulation signal 313 (e.g., PWM_Duty) and the voltage signal 323 (e.g., Vc) and generates a power detection signal 331. For example, the power detection signal 331 is a voltage signal. In certain examples, the power detection signal 331 (e.g., VP) represents the input power. In some examples, the power detection signal 331 (e.g., VP) changes linearly with the input power. For example, the power detection signal 331 (e.g., VP) increases linearly with the increasing input power. As an example, the power detection signal 331 (e.g., VP) decreases linearly with the decreasing input power.

According to some embodiments, the power detector 300 is used as the power detector 200, the voltage-to-duty-cycle converter 310 is used as the signal converter 210, the current-to-voltage converter 320 is used as the signal converter 220, and the low-pass filter 330 is used as the low-pass filter 230. For example, the input voltage 311 (e.g., V1) is used as the input signal 211, and the input current 321 (e.g., I1) is used as the input signal 221. As an example, the pulse-width-modulation signal 313 (e.g., PWM_Duty) is used as the pulse-width-modulation signal 213, the voltage signal 323 (e.g., Vc) is used as the voltage signal 223, and the power detection signal 331 (e.g., VP) is used as the power detection signal 231.

Figure 3B:
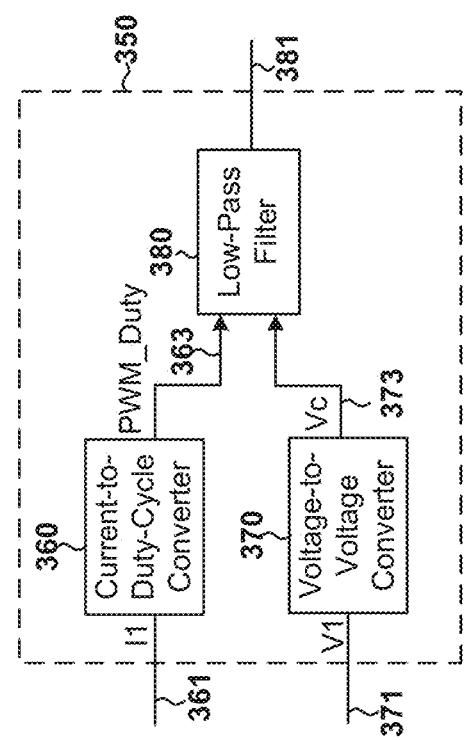
FIG. 3B is a simplified diagram showing a power detector according to certain embodiments of the present invention.

FIG. 3B is a simplified diagram showing a power detector according to certain embodiments of the present invention. This diagram is merely an example, which should not unduly limit the scope of the claims. One of ordinary skill in the art would recognize many variations, alternatives, and modifications. As shown in FIG. 3B, the power detector 350 includes a current-to-duty-cycle converter 360, a voltage-to-voltage converter 370, and a low-pass filter 380. Although the above has been shown using a selected group of components for the power detector 350, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

According to some embodiments, the current-to-duty-cycle converter 360 receives an input current 361 (e.g., I1) and converts the input current 361 (e.g., I1) to a pulse-width-modulation signal 363, and the voltage-to-voltage converter 370 receives an input voltage 371 (e.g., V1) and converts the input voltage 371 (e.g., V1) to a voltage signal 373 (e.g., Vc). For example, the pulse-width-modulation signal 363 is a voltage signal (e.g., PWM_Duty). As an example, the pulse-width-modulation signal 363 is a logic signal, which has a logic high level corresponding to a high voltage value and also has a logic low level corresponding to a low voltage value.

In certain examples, the duty cycle of the pulse-width-modulation signal 363 changes linearly with the magnitude of the input current 361 (e.g., I1). For example, the duty cycle of the pulse-width-modulation signal 363 increases linearly with the increasing magnitude of the input current 361 (e.g., I1). As an example, the duty cycle of the pulse-width-modulation signal 363 decreases linearly with the decreasing magnitude of the input current 361 (e.g., I1).

In some examples, the magnitude of the voltage signal 373 changes linearly with the magnitude of the input voltage 371 (e.g., V1). For example, the magnitude of the voltage signal 373 increases linearly with the increasing magnitude of the input voltage 371 (e.g., V1). As an example, the magnitude of the voltage signal 373 decreases linearly with the decreasing magnitude of the input voltage 371 (e.g., V1).

In certain examples, the voltage-to-voltage converter 370 converts the input voltage 371 to the voltage signal 373 as follows:

$$V_c = M \times V_1 \quad \text{(Equation 2)}$$

where $V_c$ represents the voltage signal 373. Additionally, $V_1$ represents the input voltage 371, and M represents a predetermined positive number.

In certain embodiments, the input current 361 (e.g., I1) multiplied by the input voltage 371 (e.g., V1) is equal to the input power. In some embodiments, the low-pass filter 380 receives the pulse-width-modulation signal 363 (e.g., PWM_Duty) and the voltage signal 373 (e.g., Vc) and generates a power detection signal 381. For example, the power detection signal 381 is a voltage signal. In some examples, the power detection signal 381 (e.g., VP) represents the input power. In certain examples, the power detection signal 381 (e.g., VP) changes linearly with the input power. For example, the power detection signal 381 (e.g., VP) increases linearly with the increasing input power. As an example, the power detection signal 381 (e.g., VP) decreases linearly with the decreasing input power.

According to some embodiments, the power detector 350 is used as the power detector 200, the current-to-duty-cycle converter 360 is used as the signal converter 210, the voltage-to-voltage converter 370 is used as the signal converter 220, and the low-pass filter 380 is used as the low-pass filter 230. For example, the input current 361 (e.g., I1) is used as the input signal 211, and the input voltage 371 (e.g., V1) is used as the input signal 221. As an example, the pulse-width-modulation signal 363 (e.g., PWM_Duty) is used as the pulse-width-modulation signal 213, the voltage signal 373 (e.g., Vc) is used as the voltage signal 223, and the power detection signal 381 (e.g., VP) is used as the power detection signal 231.

As discussed above and further emphasized here, FIG. 3B is merely an example, which should not unduly limit the scope of the claims. One of ordinary skill in the art would recognize many variations, alternatives, and modifications. For example, the voltage-to-voltage converter 370 is removed, and the input voltage 371 (e.g., V1) is used as the voltage signal 373 (e.g., Vc). As an example, the voltage signal 373 (e.g., Vc) is the same as the input voltage 371 (e.g., V1).

Figure 4A:
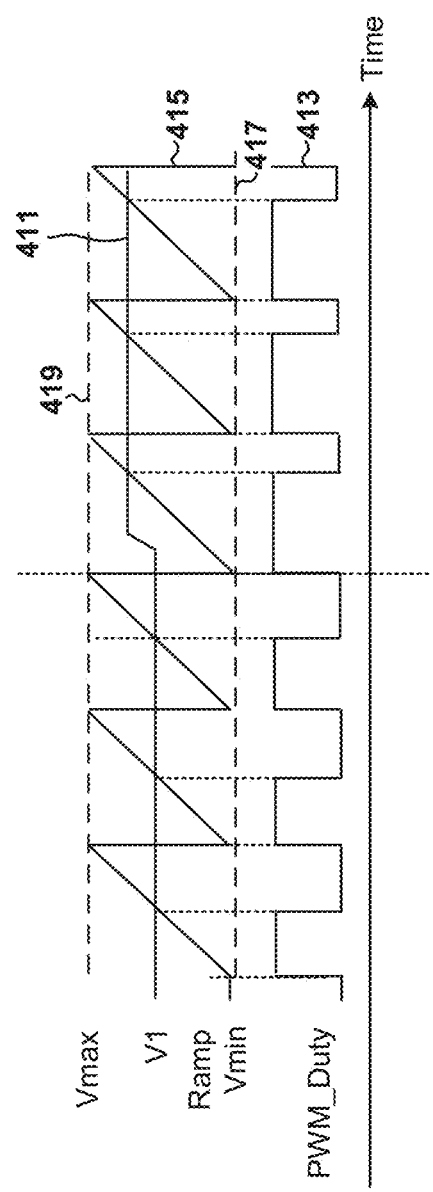
FIG. 4A shows simplified timing diagrams for the voltage-to-duty-cycle converter as part of the power detector as shown in FIG. 3A according to certain embodiments of the present invention.

FIG. 4A shows simplified timing diagrams for the voltage-to-duty-cycle converter 310 as part of the power detector 300 as shown in FIG. 3A according to certain embodiments of the present invention. These diagrams are merely examples, which should not unduly limit the scope of the claims. One of ordinary skill in the art would recognize many variations, alternatives, and modifications. The waveform 411 represents the input voltage 311 (e.g., V1) as a function of time, and the waveform 413 represents the pulse-width-modulation signal 313 (e.g., PWM_Duty) as a function of time. Additionally, the waveform 415 represents a ramp voltage as a function of time, the waveform 417 represents a predetermined minimum voltage, and the waveform 419 represents a predetermined maximum voltage.

According to some embodiments, the voltage-to-duty-cycle converter 310 uses the ramp voltage as shown by the waveform 415 to convert the input voltage 311 (e.g., V1) as shown by the waveform 411 to the pulse-width-modulation signal 313 (e.g., PWM_Duty) as shown by the waveform 413. In certain examples, the ramp voltage ramps up at a constant slope from the predetermined minimum voltage to the predetermined maximum voltage. For example, the predetermined minimum voltage remains constant with time as shown by the waveform 417. As an example, the predetermined maximum voltage remains constant with time as shown by the waveform 419. In some examples, the ramp voltage has a constant frequency. For example, if the ramp voltage reaches the predetermined maximum voltage, the ramp voltage drops from the predetermined maximum voltage to the predetermined minimum voltage. As an example, after the ramp voltage drops to the predetermined minimum voltage, the ramp voltage immediately starts ramping up again.

According to certain embodiments, when the ramp voltage starts ramping up from the predetermined minimum voltage as shown by the waveform 415, the pulse-width-modulation signal 313 (e.g., PWM_Duty) changes from a logic low level to a logic high level as shown by the waveform 413, and when the ramp voltage reaches the input voltage 311 (e.g., V1) as shown by the waveform 415, the pulse-width-modulation signal 313 (e.g., PWM_Duty) changes from the logic high level to the logic low level as shown by the waveform 413. For example, when the ramp voltage is larger than the predetermined minimum voltage and smaller than the input voltage 311 (e.g., V1), the pulse-width-modulation signal 313 (e.g., PWM_Duty) remains at the logic high level. As an example, when the ramp voltage is larger than the input voltage 311 (e.g., V1) and smaller than the predetermined maximum voltage, the pulse-width-modulation signal 313 (e.g., PWM_Duty) remains at the logic low level.

In some examples, the input voltage 311 is larger than or equal to the predetermined minimum voltage and is smaller than or equal to the predetermined maximum voltage. For example, if the predetermined minimum voltage is equal to zero, the duty cycle of the pulse-width-modulation signal 313 (e.g., PWM_Duty) is determined as follows:

$$D = \frac{V_1}{V_{max}} \quad \text{(Equation 3)}$$

where D represents the duty cycle of the pulse-width-modulation signal 313, $V_1$ represents the input voltage 311, and $V_{max}$ represents the predetermined maximum voltage. As an example, the input voltage 311 is larger than or equal to the predetermined minimum voltage and is smaller than or equal to the predetermined maximum voltage, so the duty cycle of the pulse-width-modulation signal 313 is larger than or equal to zero and is smaller than or equal to one.

Figure 4B:
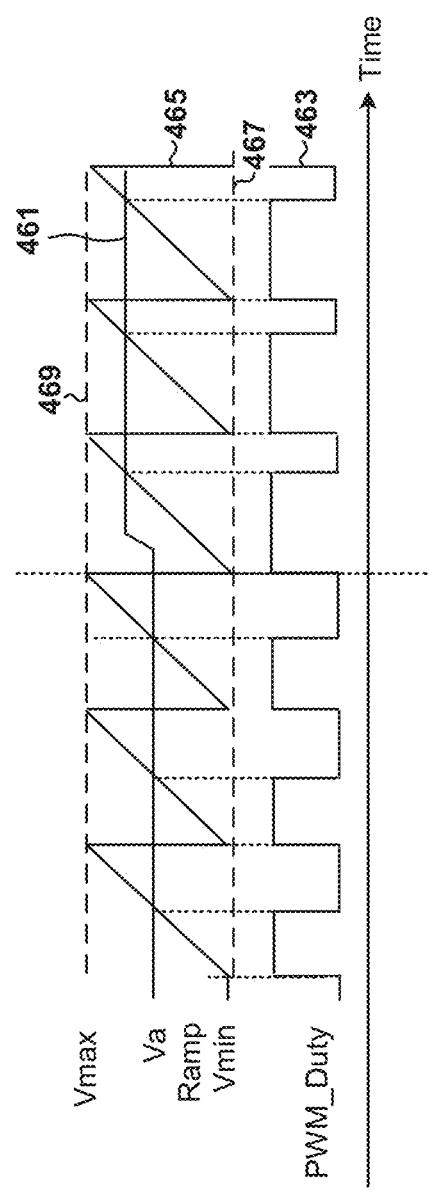
FIG. 4B shows simplified timing diagrams for the current-to-duty-cycle converter as part of the power detector as shown in FIG. 3B according to certain embodiments of the present invention.

FIG. 4B shows simplified timing diagrams for the current-to-duty-cycle converter 360 as part of the power detector 350 as shown in FIG. 3B according to certain embodiments of the present invention. These diagrams are merely examples, which should not unduly limit the scope of the claims. One of ordinary skill in the art would recognize many variations, alternatives, and modifications. The waveform 461 represents an intermediate voltage (e.g., Va) converted from the input current 361 (e.g., I1) as a function of time, and the waveform 463 represents the pulse-width-modulation signal 363 (e.g., PWM_Duty) as a function of time. Additionally, the waveform 465 represents a ramp voltage as a function of time, the waveform 467 represents a predetermined minimum voltage, and the waveform 469 represents a predetermined maximum voltage.

According to some embodiments, the current-to-duty-cycle converter 360 converts the input current 361 (e.g., I1) to the intermediate voltage (e.g., Va) as shown by the waveform 461 and uses the ramp voltage as shown by the waveform 465 to convert the intermediate voltage (e.g., Va) to the pulse-width-modulation signal 363 (e.g., PWM_Duty) as shown by the waveform 463. For example, the current-to-duty-cycle converter 360 includes one or more resistors, which convert the input current 361 (e.g., I1) to the intermediate voltage (e.g., Va). In certain examples, the ramp voltage ramps up at a constant slope from the predetermined minimum voltage to the predetermined maximum voltage. For example, the predetermined minimum voltage remains constant with time as shown by the waveform 467. As an example, the predetermined maximum voltage remains constant with time as shown by the waveform 469. In some examples, the ramp voltage has a constant frequency. For example, if the ramp voltage reaches the predetermined maximum voltage, the ramp voltage drops from the predetermined maximum voltage to the predetermined minimum voltage. As an example, after the ramp voltage drops to the predetermined minimum voltage, the ramp voltage immediately starts ramping up again.

According to certain embodiments, when the ramp voltage starts ramping up from the predetermined minimum voltage as shown by the waveform 465, the pulse-widthmodulation signal 363 (e.g., PWM_Duty) changes from a logic low level to a logic high level as shown by the waveform 463, and when the ramp voltage reaches the intermediate voltage (e.g., Va) as shown by the waveform 465, the pulse-width-modulation signal 363 (e.g., PWM_Duty) changes from the logic high level to the logic low level as shown by the waveform 463. For example, when the ramp voltage is larger than the predetermined minimum voltage and smaller than the intermediate voltage (e.g., Va), the pulse-width-modulation signal 363 (e.g., PWM_Duty) remains at the logic high level. As an example, when the ramp voltage is larger than the intermediate voltage (e.g., Va) and smaller than the predetermined maximum voltage, the pulse-width-modulation signal 363 (e.g., PWM_Duty) remains at the logic low level.

In some examples, the current-to-duty-cycle converter 360 includes a resistor, which converts the input current 361 to the intermediate voltage as follows:

$$V_a = I_1 \times R_y \qquad \text{(Equation 4)}$$

where $V_a$ represents the intermediate voltage. Additionally, $I_1$ represents the input current 361, and $R_y$ represents the resistance of the resistor that converts the input current 361 to the intermediate voltage according to some embodiments.

In certain examples, the intermediate voltage is larger than or equal to the predetermined minimum voltage and is smaller than or equal to the predetermined maximum voltage. For example, if the predetermined minimum voltage is equal to zero, the duty cycle of the pulse-width-modulation signal 363 (e.g., PWM_Duty) is determined as follows:

$$D = \frac{V_a}{V_{max}} \qquad \text{(Equation 5)}$$

where D represents the duty cycle of the pulse-width-modulation signal 363, $V_a$ represents the intermediate voltage, and $V_{max}$ represents the predetermined maximum voltage. As an example, the intermediate voltage is larger than or equal to the predetermined minimum voltage and is smaller than or equal to the predetermined maximum voltage, so the duty cycle of the pulse-width-modulation signal 363 is larger than or equal to zero and is smaller than or equal to one.

Figure 5:
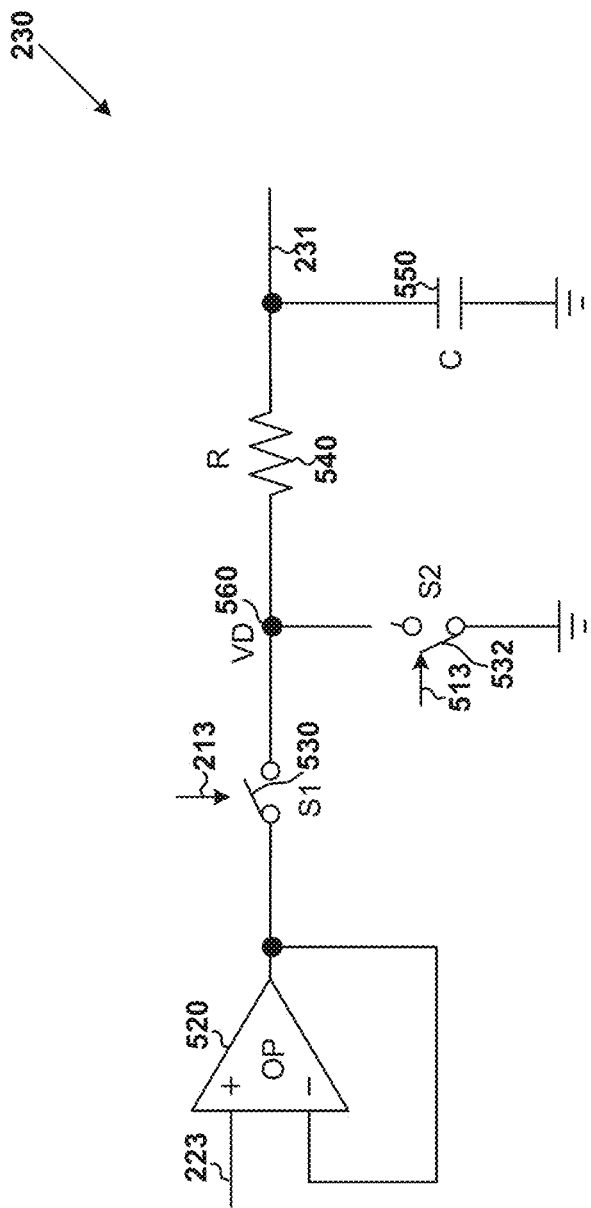
FIG. 5 is a simplified diagram showing the low-pass filter as part of the power detector as shown in FIG. 2 according to certain embodiments of the present invention.

FIG. 5 is a simplified diagram showing the low-pass filter 230 as part of the power detector 200 as shown in FIG. 2 according to certain embodiments of the present invention. This diagram is merely an example, which should not unduly limit the scope of the claims. One of ordinary skill in the art would recognize many variations, alternatives, and modifications. As shown in FIG. 5, the low-pass filter 230 includes an operational amplifier 520, switches 530 and 532, a resistor 540, and a capacitor 550. For example, the low-pass filter 230 is the low-pass filter 330. As an example, the low-pass filter 230 is the low-pass filter 380. Although the above has been shown using a selected group of components for the low-pass filter 230, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

Figure 6:
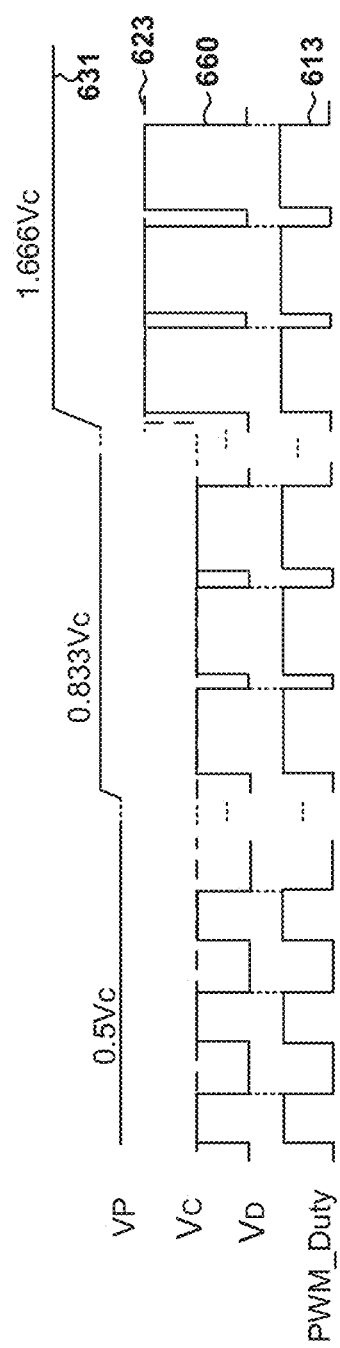
FIG. 6 shows simplified timing diagrams for the low-pass filter as part of the power detector as shown in FIG. 2 and FIG. 5 according to certain embodiments of the present invention.

According to some embodiments, the non-inverting input terminal (e.g., the "+" terminal) of the operational amplifier 520 receives the voltage signal 223 (e.g., the voltage signal 323 and/or the voltage signal 373). In certain examples, the switch 530 is controlled by the pulse-width-modulation signal 213, and the switch 532 is controlled by another pulse-width-modulation signal 313, wherein if the pulse-width-modulation signal 213 is at a logic high level, the pulse-width-modulation signal 313 is at a logic low level, and if the pulse-width-modulation signal 213 is at the logic low level, the pulse-width-modulation signal 313 is at the logic high level. For example, if the pulse-width-modulation signal 213 is at the logic high level, the switch 530 is closed, and if the pulse-width-modulation signal 213 is at the logic low level, the switch 530 is open. As an example, if the pulse-width-modulation signal 313 is at the logic high level, the switch 532 is closed, and if the pulse-width-modulation signal 313 is at the logic low level, the switch 532 is open. In certain examples, one terminal of the capacitor 550 is biased to a ground voltage, and another terminal of the capacitor 550 is used to provide the power detection signal 231 (e.g., the power detection signal 331 and/or the power detection signal 381). In some examples, one terminal of the switch 530, one terminal of the switch 532, and one terminal of the resistor 540 are connected and biased to a voltage FIG. 6 shows simplified timing diagrams for the low-pass filter 230 as part of the power detector 200 as shown in FIG. 2 and FIG. 5 according to certain embodiments of the present invention. These diagrams are merely examples, which should not unduly limit the scope of the claims. One of ordinary skill in the art would recognize many variations, alternatives, and modifications. The waveform 613 represents the pulse-width-modulation signal 213 (e.g., PWM_Duty) as a function of time, the waveform 623 represents the voltage signal 223 (e.g., Vc) as a function of time, and the waveform 631 represents the power detection signal 231 (e.g., VP) as a function of time. Additionally, the waveform 660 represents the voltage 560 (e.g., VD) as a function of time.

In some embodiments, as shown in FIG. 5, if the pulse-width-modulation signal 213 (e.g., PWM_Duty) is at a logic high level, the switch 530 is closed and the switch 532 is open, causing the voltage 560 (e.g., VD) to become equal to the voltage signal 223 (e.g., Vc). In certain embodiments, as shown in FIG. 5, if the pulse-width-modulation signal 213 (e.g., PWM_Duty) is at a logic low level, the switch 530 is open and the switch 532 is closed, causing the voltage 560 (e.g., VD) to drop to zero. For example, the voltage 560 (e.g., VD) changes between the voltage signal 223 (e.g., Vc) and zero. As an example, the voltage 560 (e.g., VD) has a duty cycle that is equal to the duty cycle of the pulse-width-modulation signal 213 (e.g., PWM_Duty) as shown by the waveform 660.

According to some embodiments, the resistor 540 and the capacitor 550 are parts of an RC circuit with an RC time constant. For example, if the RC time constant is much longer than one period of the pulse-width-modulation signal 213, the power detection signal 231 approximately equals the average magnitude of the voltage 560 (e.g., VD). As an example, the power detection signal 231 represents the input power. In some examples, if the voltage signal 223 (e.g., Vc) does not change, the power detection signal 231 changes linearly with the duty cycle of the pulse-width-modulation signal 213. In certain examples, if the duty cycle of the pulse-width-modulation signal 213 does not change, the power detection signal 231 changes linearly with the voltage signal 223 (e.g., Vc).

According to certain embodiments, the power detection signal 231 is determined as follows:

$$V_P = V_c \times D \qquad \text{(Equation 6)}$$

where $V_P$ represents the power detection signal 231. Additionally, $V_c$ represents the voltage signal 223, and D represents the duty cycle of the pulse-width-modulation signal 213.

In some examples, as shown in FIG. 3A, the input signal 211 is the input voltage 311 (e.g., V1) and the input signal 221 is the input current 321 (e.g., I1). For example, combining Equation 6 with Equation 1 and Equation 3, the following is obtained:

$$V_P = (I_1 \times R_x) \times \frac{V_1}{V_{max}} = \frac{R_x}{V_{max}} \times (I_1 \times V_1) = \frac{R_x}{V_{max}} \times P_1 \quad \text{(Equation 7)}$$

where $V_P$ represents the power detection signal 231, and $P_1$ represents the input power. As an example, as shown by Equation 7, the power detection signal 231 linearly changes with the input power.

In certain examples, as shown in FIG. 3B, the input signal 211 is the input current 361 (e.g., I1), and the input signal 221 is the input voltage 371 (e.g., V1). For example, if the voltage signal 223 (e.g., Vc) is equal to the input voltage 371 (e.g., V1), combining Equation 6 with Equation 2, Equation 4 and Equation 5, the following is obtained:

$$V_P = M \times V_1 \times \frac{I_1 \times R_y}{V_{max}} = \frac{M \times R_y}{V_{max}} \times (V_1 \times I_1) = \frac{M \times R_y}{V_{max}} \times P_1 \quad \text{(Equation 8)}$$

where $V_P$ represents the power detection signal 231, and $P_1$ represents the input power. As an example, as shown by Equation 8, the power detection signal 231 linearly changes with the input power.

Figure 7:
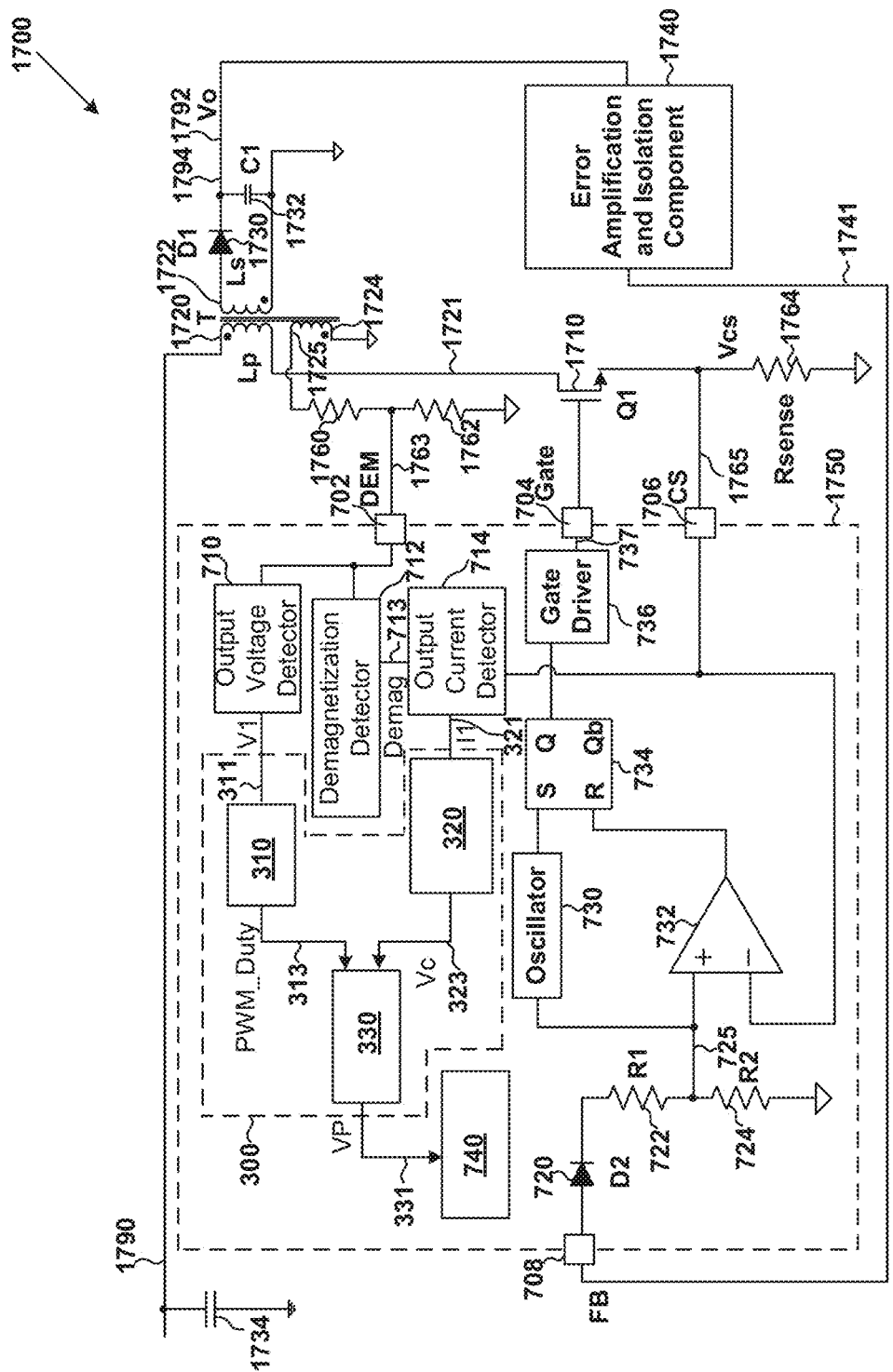
FIG. 7 is a simplified diagram showing certain components of a flyback power converter that includes the power detector as shown in FIG. 3A according to certain embodiments of the present invention.

FIG. 7 is a simplified diagram showing certain components of a flyback power converter that includes the power detector 300 as shown in FIG. 3A according to certain embodiments of the present invention. This diagram is merely an example, which should not unduly limit the scope of the claims. One of ordinary skill in the art would recognize many variations, alternatives, and modifications. As shown in FIG. 7, the flyback power converter 1700 includes a transistor 1710, a primary winding 1720, a secondary winding 1722, an auxiliary winding 1724, a diode 1730, capacitors 1732 and 1734, an error amplification and isolation component 1740, a controller 1750, and resistors 1760, 1762 and 1764. For example, the controller 1750 includes terminals 702, 704, 706 and 708. As an example, the controller 1750 also includes an output voltage detector 710, a demagnetization detector 712, an output current detector 714, a diode 720, resistors 722 and 724, an oscillator 730, a comparator 732, a flip flop 734, a gate driver 736, and an output power comparison and compensation circuit 740. For example, the controller 1750 further includes the power detector 300 that includes the voltage-to-duty-cycle converter 310, the current-to-voltage converter 320, and the low-pass filter 330. Although the above has been shown using a selected group of components for the flyback power converter 1700, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 7, the flyback power converter 1700 provides an output voltage 1792 (e.g., Vo) and an output current 1794 (e.g., Io) and delivers an output power (e.g., Po) according to certain embodiments. For example, the output power (e.g., Po) of the flyback power converter 1700 equals the output voltage 1792 (e.g., Vo) multiplied by the output current 1794 (e.g., Io). In some examples, the gate driver 736 of the controller 1750 generates a drive signal 737 and outputs the drive signal 737 to the transistor 1710 (e.g., Q1) through the terminal 704 (e.g., Gate) in order to turn on and/or turn off the transistor 1710 (e.g., Q1). In certain examples, the auxiliary winding 1724 generates a voltage 1725, which is used by a voltage divider that includes the resistors 1760 and 1762 to generate a voltage 1763. For example, the voltage 1763 is received by the output voltage detector 710 and the demagnetization detector 712 through the terminal 702 (e.g., DEM).

In some embodiments, if the transistor 1710 (e.g., Q1) is turned on by the drive signal 737, the primary winding 1720 (e.g., Lp) is charged by a voltage 1790, the diode 1730 (e.g., D1) is reverse biased, and the capacitor 1732 (e.g., C1) provides the output voltage 1792 (e.g., Vo) and the output current 1794 (e.g., Io). In certain examples, if the transistor 1710 (e.g., Q1) is turned on, based at least in part on the output voltage 1792 (e.g., Vo), the error amplification and isolation component 1740 generates a feedback signal 1741. For example, the feedback signal 1741 is received by the terminal 708 (e.g., FB) of the controller 1750 (e.g., a pulse-width-modulation controller). As an example, based at least in part on the feedback signal 1741, the controller 1750 (e.g., a pulse-width-modulation controller) uses at least a voltage divider that includes the resistor 722 (e.g., R1) and the resistor 724 (e.g., R2) to generate a signal 725. In some examples, if the transistor 1710 (e.g., Q1) is turned on, a current 1721 flows through the primary winding 1720 (e.g., Lp), the transistor 1710 (e.g., Q1) and the resistor 1764 (e.g., Rsense) and generates a sensing voltage 1765 (e.g., Vcs), which is received by the terminal 706 (e.g., CS) of the controller 1750 (e.g., a pulse-width-modulation controller). For example, the controller 1750 (e.g., a pulse-width-modulation controller) processes information associated with the signal 725 and the sensing voltage 1765 (e.g., Vcs) and controls the frequency and/or the duty cycle of the drive signal 737 in order to regulate the output voltage 1792 (e.g., Vo) at a constant value.

In certain embodiments, if the transistor 1710 (e.g., Q1) is turned off by the drive signal 737, the secondary winding 1722 undergoes a demagnetization process, the diode 1730 (e.g., D1) is forward biased, and the secondary winding 1722 charges the capacitor 1732 (e.g., C1) and also provides the output voltage 1792 (e.g., Vo) and the output current 1794 (e.g., Io). For example, the demagnetization detector 712 uses the voltage 1763 to generate a demagnetization signal 713 (e.g., Demag), which indicates the beginning and the end of the demagnetization process. In some examples, if the transistor 1710 (e.g., Q1) is turned off, based at least in part on the voltage 1763, the output voltage detector 710 generates the input voltage 311 (e.g., V1), which changes linearly with the output voltage 1792 (e.g., Vo) of the flyback power converter 1700. For example, if the output voltage 1792 (e.g., Vo) increases, the input voltage 311 (e.g., V1) increases linearly with the output voltage 1792 (e.g., Vo). As an example, if the output voltage 1792 (e.g., Vo) decreases, the input voltage 311 (e.g., V1) decreases linearly with the output voltage 1792 (e.g., Vo). In certain examples, the demagnetization signal 713 (e.g., Demag) is received by the output current detector 714, which also receives the sensing voltage 1765 (e.g., Vcs) and generates the input current 321 (e.g., I1), wherein the input current 321 (e.g., I1) changes linearly with the output current 1794 (e.g., Io) of the flyback power converter 1700. For example, if the output current 1794 (e.g., Io) increases, the input current 321 (e.g., I1) increases linearly with the output current 1794 (e.g., Io). As an example, if the output current 1794 (e.g., Io) decreases, the input current 321 (e.g., T1) decreases linearly with the output current 1794 (e.g., Io). In some examples, the output current detector 714 uses the sensing voltage 1765 (e.g., Vcs) to determine the average magnitude of the current 1721 when the transistor 1710 (e.g., Q1) is turned on, and uses the demagnetization signal 713 (e.g., Demag) to determine the time duration for the demagnetization process when the transistor 1710 (e.g., Q1) is turned off. For example, based at least in part on the average magnitude of the current 1721 when the transistor 1710 (e.g., Q1) is turned on and the time duration for the demagnetization process when the transistor 1710 (e.g., Q1) is turned off, the output current detector 714 performs an integral operation to generate the input current 321 (e.g., I1). As an example, the input current 321 (e.g., I1) changes linearly with the output current 1794 (e.g., Io) of the flyback power converter 1700.

As shown in FIG. 3A, the power detector 300 receives the input voltage 311 (e.g., V1) and the input current 321 (e.g., I1) and generates the power detection signal 331 based at least in part on the input voltage 311 (e.g., V1) and the input current 321 (e.g., I1) according to some embodiments. For example, the power detection signal 331 (e.g., VP) represents the input power that equals the input voltage 311 (e.g., V1) multiplied by the input current 321 (e.g., I1). In certain examples, the input voltage 311 (e.g., V1) changes linearly with the output voltage 1792 (e.g., Vo) of the flyback power converter 1700, and the input current 321 (e.g., I1) changes linearly with the output current 1794 (e.g., Io) of the flyback power converter 1700. For example, the output power (e.g., Po) of the flyback power converter 1700 equals the output voltage 1792 (e.g., Vo) multiplied by the output current 1794 (e.g., Io). As an example, the power detection signal 331 (e.g., VP) represents the output power (e.g., Po) of the flyback power converter 1700. In some examples, the power detection signal 331 (e.g., VP) changes linearly with the output power (e.g., Po) of the flyback power converter 1700. For example, the power detection signal 331 (e.g., VP) increases linearly with the increasing output power (e.g., Po) of the flyback power converter 1700. As an example, the power detection signal 331 (e.g., VP) decreases linearly with the decreasing output power (e.g., Po) of the flyback power converter 1700.

As shown in FIG. 7, the power detection signal 331 (e.g., VP) is received by the output power comparison and compensation circuit 740 according to certain embodiments. For example, the output power comparison and compensation circuit 740 uses the power detection signal 331 (e.g., VP) to perform constant output power regulation, over-power protection, and/or over-current protection. As an example, the output power comparison and compensation circuit 740 uses the power detection signal 331 (e.g., VP) to support a wide range of the output voltage 1792 (e.g., Vo) and/or a wide range of the output power (e.g., Po) of the flyback power converter 1700.

Figure 8:
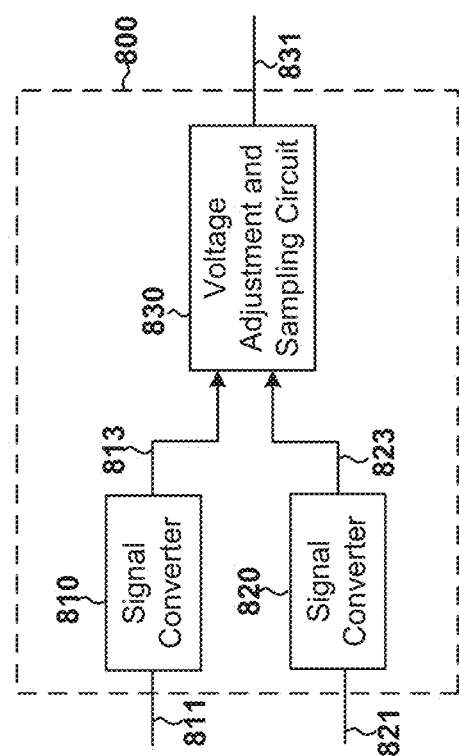
FIG. 8 is a simplified diagram showing a power detector according to certain embodiments of the present invention.

FIG. 8 is a simplified diagram showing a power detector according to certain embodiments of the present invention. This diagram is merely an example, which should not unduly limit the scope of the claims. One of ordinary skill in the art would recognize many variations, alternatives, and modifications. As shown in FIG. 8, the power detector 800 includes a signal converter 810, a signal converter 820, and a voltage adjustment and sampling circuit 830. Although the above has been shown using a selected group of components for the power detector 800, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

According to some embodiments, the signal converter 810 receives an input signal 811 and converts the input signal 811 to a logic signal 813, and the signal converter 820 receives an input signal 821 and converts the input signal 821 to a current signal 823. For example, the logic signal 813 is a voltage signal. As an example, the logic signal 813 has a logic high level corresponding to a high voltage value and also has a logic low level corresponding to a low voltage value. For example, the length of time when the logic signal 813 is at the logic high level is the pulse width of the logic signal 813, and the length of time when the logic signal 813 is at the logic low level is the off time of the logic signal 813. In certain examples, the off time of the logic signal 813 remains constant, regardless of whether the pulse width of the logic signal 813 changes or not. For example, even if the pulse width of the logic signal 813 changes, the off time of the logic signal 813 remains constant. As an example, if the pulse width of the logic signal 813 changes, the frequency of the logic signal 813 and the period of the pulse-width-modulation signal 213 both change.

In some examples, the pulse width of the logic signal 813 changes linearly with the magnitude of the input signal 811, and the off time of the logic signal 813 remains unchanged. For example, the pulse width of the logic signal 813 increases linearly with the increasing magnitude of the input signal 811, and the off time of the logic signal 813 remains unchanged. As an example, the pulse width of the logic signal 813 decreases linearly with the decreasing magnitude of the input signal 811, and the off time of the logic signal 813 remains unchanged. In certain examples, the magnitude of the current signal 823 changes linearly with the magnitude of the input signal 821. For example, the magnitude of the current signal 823 increases linearly with the increasing magnitude of the input signal 821. As an example, the magnitude of the current signal 823 decreases linearly with the decreasing magnitude of the input signal 821.

In certain embodiments, if the input signal 811 is an input voltage, the input signal 821 is an input current, and if the input signal 811 is an input current, the input signal 821 is an input voltage. For example, the input power is equal to the input voltage multiplied by the input current. As an example, the input power is equal to the input signal 811 multiplied by the input signal 821. In some embodiments, the voltage adjustment and sampling circuit 830 (e.g., a signal generator) receives the logic signal 813 and the current signal 823 and generates a power detection signal 831. For example, the power detection signal 831 is a voltage signal. In certain examples, the power detection signal 831 represents the input power. In some examples, the power detection signal 831 changes linearly with the input power. For example, the power detection signal 831 increases linearly with the increasing input power. As an example, the power detection signal 831 decreases linearly with the decreasing input power.

Figure 9A:
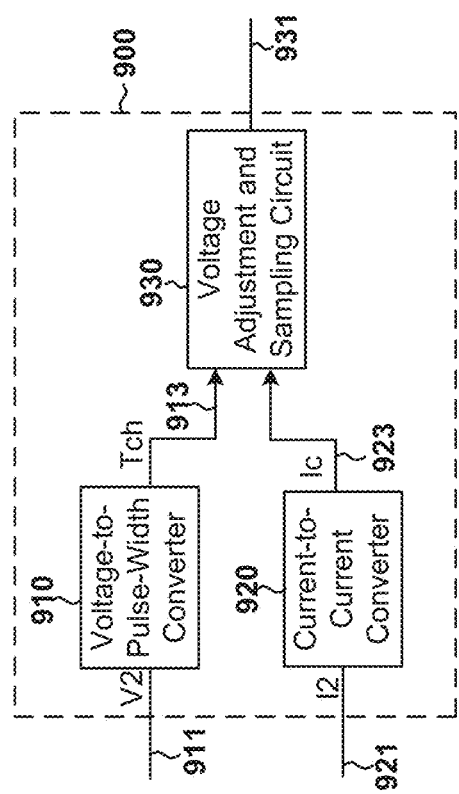
FIG. 9A is a simplified diagram showing a power detector according to certain embodiments of the present invention.

FIG. 9A is a simplified diagram showing a power detector according to certain embodiments of the present invention. This diagram is merely an example, which should not unduly limit the scope of the claims. One of ordinary skill in the art would recognize many variations, alternatives, and modifications. As shown in FIG. 9A, the power detector 800 includes a voltage-to-pulse-width converter 910, a current-to-current converter 920, and a voltage adjustment and sampling circuit 930. Although the above has been shown using a selected group of components for the power detector 900, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

According to some embodiments, the voltage-to-pulse-width converter 910 receives an input voltage 911 (e.g., V2) and converts the input voltage 911 (e.g., V2) to a logic signal 913, and the current-to-current converter 920 receives an input current 921 (e.g., I2) and converts the input current 921 (e.g., I2) to a current signal 923 (e.g., Ic). For example, the logic signal 913 is a voltage signal (e.g., Tch). As an example, the logic signal 913 has a logic high level corresponding to a high voltage value and also has a logic low level corresponding to a low voltage value. For example, the length of time when the logic signal 913 is at the logic high level is the pulse width of the logic signal 913, and the length of time when the logic signal 913 is at the logic low level is the off time of the logic signal 913.

In certain examples, the pulse width of the logic signal 913 changes linearly with the magnitude of the input voltage 911 (e.g., V2), and the off time of the logic signal 913 remains unchanged. For example, the pulse width of the logic signal 913 increases linearly with the increasing magnitude of the input voltage 911 (e.g., V2), and the off time of the logic signal 913 remains unchanged. As an example, the pulse width of the logic signal 913 decreases linearly with the decreasing magnitude of the input voltage 911 (e.g., V2), and the off time of the logic signal 913 remains unchanged.

In some examples, the magnitude of the current signal 923 changes linearly with the magnitude of the input current 921 (e.g., I2). For example, the magnitude of the current signal 923 increases linearly with the increasing magnitude of the input current 921 (e.g., I2). As an example, the magnitude of the voltage signal 923 decreases linearly with the decreasing magnitude of the input current 921 (e.g., I2).

In certain examples, the current-to-current converter 920 converts the input current 921 to the current signal 923 as follows:

$$I_c = \beta \times I_2 \quad \text{(Equation 9)}$$

where $I_c$ represents the current signal 923. Additionally, $I_2$ represents the input current 921, and $\beta$ represents a predetermined positive number.

In some embodiments, the input voltage 911 (e.g., V2) multiplied by the input current 921 (e.g., I2) is equal to the input power. In some embodiments, the voltage adjustment and sampling circuit 930 receives the logic signal 913 (e.g., Tch) and the current signal 923 (e.g., Ic) and generates a power detection signal 931. For example, the power detection signal 931 is a voltage signal. In some examples, the power detection signal 931 (e.g., VP) represents the input power. In certain examples, the power detection signal 931 (e.g., VP) changes linearly with the input power. For example, the power detection signal 931 (e.g., VP) increases linearly with the increasing input power. As an example, the power detection signal 931 (e.g., VP) decreases linearly with the decreasing input power.

In certain embodiments, the power detector 900 is used as the power detector 800, the voltage-to-pulse-width converter 910 is used as the signal converter 810, the current-to-current converter 920 is used as the signal converter 820, and the voltage adjustment and sampling circuit 930 is used as the voltage adjustment and sampling circuit 830. For example, the input voltage 911 (e.g., V2) is used as the input signal 811, and the input current 921 (e.g., I2) is used as the input signal 821. As an example, the logic signal 913 (e.g., Tch) is used as the logic signal 813, the current signal 923 (e.g., Ic) is used as the current signal 823, and the power detection signal 931 (e.g., $V_P$) is used as the power detection signal 831.

As discussed above and further emphasized here, FIG. 9A is merely an example, which should not unduly limit the scope of the claims. One of ordinary skill in the art would recognize many variations, alternatives, and modifications. For example, the current-to-current converter 920 is removed, and the input current 921 (e.g., I2) is used as the current signal 923 (e.g., Ic). As an example, the current signal 923 (e.g., Ic) is the same as the input current 921 (e.g., I2).

Figure 9B:
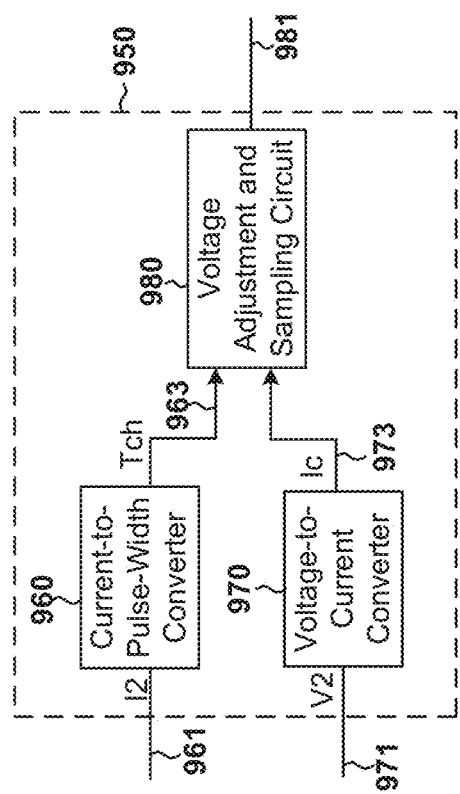
FIG. 9B is a simplified diagram showing a power detector according to certain embodiments of the present invention.

FIG. 9B is a simplified diagram showing a power detector according to certain embodiments of the present invention. This diagram is merely an example, which should not unduly limit the scope of the claims. One of ordinary skill in the art would recognize many variations, alternatives, and modifications. As shown in FIG. 9B, the power detector 950 includes a current-to-pulse-width converter 960, a voltage-to-current converter 970, and a voltage adjustment and sampling circuit 980. Although the above has been shown using a selected group of components for the power detector 950, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

According to some embodiments, the current-to-pulse-width converter 960 receives an input current 961 (e.g., I2) and converts the input current 961 (e.g., I2) to a logic signal 963, and the voltage-to-current converter 970 receives an input voltage 971 (e.g., V2) and converts the input voltage 971 (e.g., V2) to a current signal 973 (e.g., Ic). For example, the logic signal 963 is a voltage signal (e.g., Tch). As an example, the logic signal 963 has a logic high level corresponding to a high voltage value and also has a logic low level corresponding to a low voltage value. For example, the length of time when the logic signal 963 is at the logic high level is the pulse width of the logic signal 963, and the length of time when the logic signal 963 is at the logic low level is the off time of the logic signal 963. In certain examples, the pulse width of the logic signal 963 changes linearly with the magnitude of the input current 961 (e.g., I2), and the off time of the logic signal 963 remains unchanged. For example, the pulse width of the logic signal 963 increases linearly with the increasing magnitude of the input current 961 (e.g., I2), and the off time of the logic signal 963 remains unchanged. As an example, the pulse width of the logic signal 963 decreases linearly with the decreasing magnitude of the input current 961 (e.g., I2), and the off time of the logic signal 963 remains unchanged. In some examples, the magnitude of the current signal 973 changes linearly with the magnitude of the input voltage 971 (e.g., V2). For example, the magnitude of the voltage signal 973 increases linearly with the increasing magnitude of the input voltage 971 (e.g., V2). As an example, the magnitude of the current signal 973 decreases linearly with the decreasing magnitude of the input voltage 971 (e.g., V2).

In certain examples, the voltage-to-current converter 970 includes one or more resistors, which convert the input voltage 971 (e.g., V2) to the current signal 973 (e.g., Ic). For example, the current signal 973 is determined as follows:

$$I_c = \frac{V_2}{R_s} \quad \text{(Equation 10)}$$

where $I_c$ represents the current signal 973. Additionally, $V_2$ represents the input voltage 971, and $R_s$ represents the resistance of the resistor that converts the input voltage 971 to the current signal 973 according to some embodiments.

In certain embodiments, the input current 961 (e.g., I2) multiplied by the input voltage 971 (e.g., V2) is equal to the input power. In some embodiments, the voltage adjustment and sampling circuit 980 receives the logic signal 963 (e.g., Tch) and the current signal 973 (e.g., Ic) and generates a power detection signal 981. For example, the power detection signal 981 is a voltage signal. In certain examples, the power detection signal 981 (e.g., VP) represents the input power. In some examples, the power detection signal 981 (e.g., VP) changes linearly with the input power. For example, the power detection signal 981 (e.g., VP) increases linearly with the increasing input power. As an example, the power detection signal 981 (e.g., VP) decreases linearly with the decreasing input power.

According to some embodiments, the power detector 950 is used as the power detector 800, the current-to-pulse-width converter 960 is used as the signal converter 810, the voltage-to-current converter 970 is used as the signal converter 820, and the voltage adjustment and sampling circuit 980 is used as the voltage adjustment and sampling circuit 830. For example, the input current 961 (e.g., I2) is used as the input signal 811, and the input voltage 971 (e.g., V2) is used as the input signal 821. As an example, the logic signal 963 (e.g., Tch) is used as the logic signal 813, the current signal 973 (e.g., Ic) is used as the current signal 823, and the power detection signal 981 (e.g., VP) is used as the power detection signal 831.

Figure 10A:
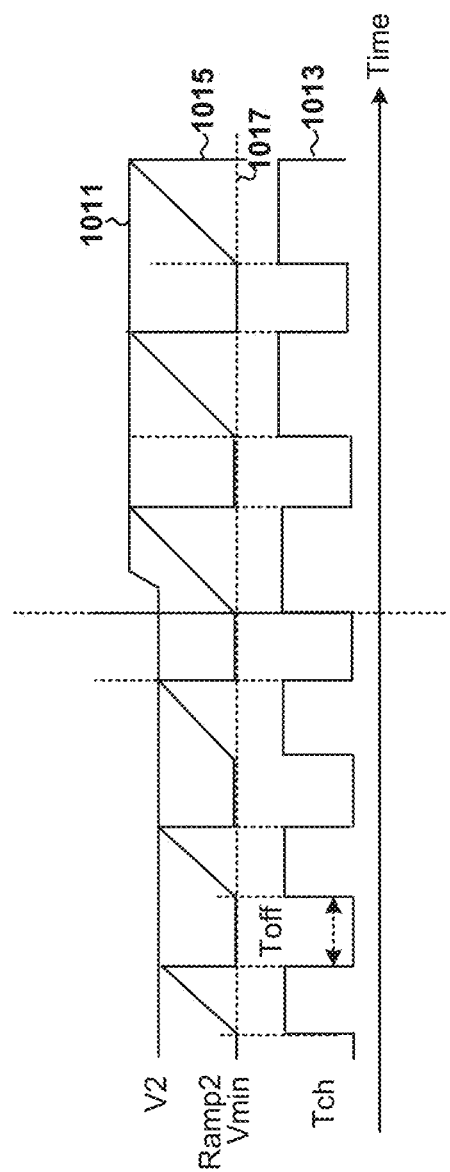
FIG. 10A shows simplified timing diagrams for the voltage-to-pulse-width converter as part of the power detector as shown in FIG. 9A according to certain embodiments of the present invention.

FIG. 10A shows simplified timing diagrams for the voltage-to-pulse-width converter 910 as part of the power detector 900 as shown in FIG. 9A according to certain embodiments of the present invention. These diagrams are merely examples, which should not unduly limit the scope of the claims. One of ordinary skill in the art would recognize many variations, alternatives, and modifications. The waveform 1011 represents the input voltage 911 (e.g., V2) as a function of time, and the waveform 1013 represents the logic signal 913 (e.g., Tch) as a function of time. Additionally, the waveform 1015 represents a ramp voltage as a function of time, and the waveform 1017 represents a predetermined minimum voltage.

According to some embodiments, the voltage-to-pulse-width converter 910 uses the ramp voltage as shown by the waveform 1015 to convert the input voltage 911 (e.g., V2) as shown by the waveform 1011 to the logic signal 1013 (e.g., Tch) as shown by the waveform 1013. In certain examples, the ramp voltage ramps up at a constant slope from the predetermined minimum voltage to the input voltage 911 (e.g., V2). For example, the predetermined minimum voltage remains constant with time as shown by the waveform 1017. In some examples, if the ramp voltage reaches the input voltage 911 (e.g., V2), the ramp voltage drops to the predetermined minimum voltage. For example, after the ramp voltage drops to the predetermined minimum voltage, the ramp voltage remains at the predetermined minimum voltage for a predetermined time duration (e.g., Toff).

According to certain embodiments, when the ramp voltage starts ramping up from the predetermined minimum voltage as shown by the waveform 1015, the logic signal 913 (e.g., Tch) changes from a logic low level to a logic high level as shown by the waveform 1013, and when the ramp voltage reaches the input voltage 911 (e.g., V2) as shown by the waveform 1015, the logic signal 313 (e.g., Tch) changes from the logic high level to the logic low level as shown by the waveform 1013. For example, when the ramp voltage ramps up from the predetermined minimum voltage to the input voltage 911 (e.g., V2), the logic signal 913 (e.g., Tch) remains at the logic high level. As an example, when the ramp voltage remains at the predetermined minimum voltage, the logic signal 913 (e.g., Tch) remains at the logic low level.

In some examples, the input voltage 911 is larger than or equal to the predetermined minimum voltage. For example, if the predetermined minimum voltage is equal to zero, the pulse width of the logic signal 913 (e.g., Tch) is determined as follows:

$$T_w = \frac{V_2}{\alpha} \quad \text{(Equation 11)}$$

where $T_w$ represents the pulse width of the logic signal 913, $V_2$ represents the input voltage 911, and $\alpha$ represents the slope at which the ramp voltage ramps up. As an example, the input voltage 911 is larger than or equal to the predetermined minimum voltage and the slope at which the ramp voltage ramps up is larger than zero, so the pulse width of the logic signal 913 is larger than or equal to zero.

Figure 10B:
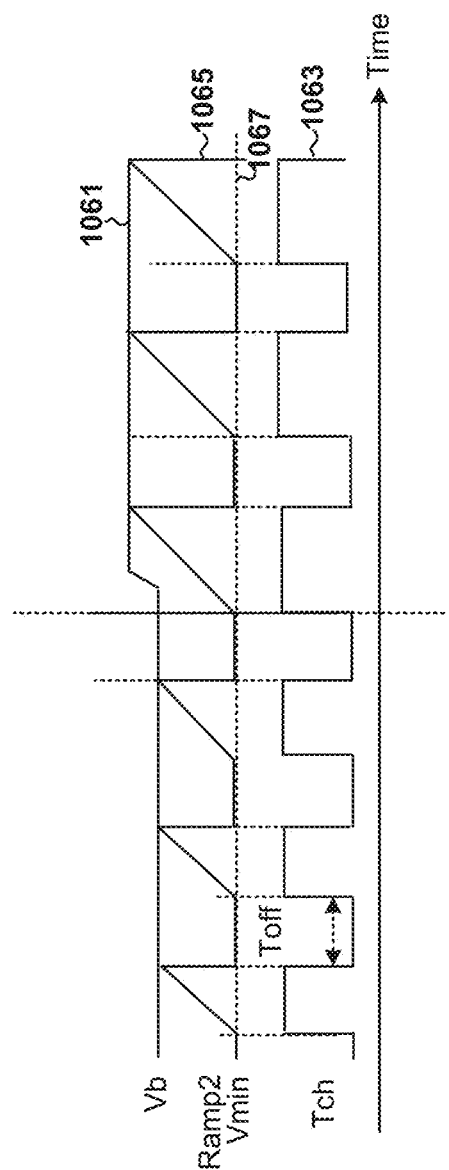
FIG. 10B shows simplified timing diagrams for the current-to-pulse-width converter as part of the power detector as shown in FIG. 9B according to certain embodiments of the present invention.

FIG. 10B shows simplified timing diagrams for the current-to-pulse-width converter 960 as part of the power detector 950 as shown in FIG. 9B according to certain embodiments of the present invention. These diagrams are merely examples, which should not unduly limit the scope of the claims. One of ordinary skill in the art would recognize many variations, alternatives, and modifications. The waveform 1061 represents an intermediate voltage (e.g., Vb) converted from the input current 961 (e.g., I2) as a function of time, and the waveform 1063 represents the logic signal 963 (e.g., Tch) as a function of time. Additionally, the waveform 1065 represents a ramp voltage as a function of time, and the waveform 1067 represents a predetermined minimum voltage.

According to some embodiments, the current-to-pulse-width converter 960 converts the input current 961 (e.g., I2) to the intermediate voltage (e.g., Vb) as shown by the waveform 1061 and uses the ramp voltage as shown by the waveform 1065 to convert the intermediate voltage (e.g., Vb) to the logic signal 963 (e.g., Tch) as shown by the waveform 1063. For example, the current-to-pulse-width converter 960 includes one or more resistors, which convert the input current 961 (e.g., I2) to the intermediate voltage (e.g., Vb). In certain examples, the ramp voltage ramps up at a constant slope from the predetermined minimum voltage to the intermediate voltage (e.g., Vb). For example, the predetermined minimum voltage remains constant with time as shown by the waveform 1067. In some examples, if the ramp voltage reaches the intermediate voltage (e.g., Vb), the ramp voltage drops to the predetermined minimum voltage. For example, after the ramp voltage drops to the predetermined minimum voltage, the ramp voltage remains at the predetermined minimum voltage for a predetermined time duration (e.g., Toff).

According to certain embodiments, when the ramp voltage starts ramping up from the predetermined minimum voltage as shown by the waveform 1065, the logic signal 1063 (e.g., Tch) changes from a logic low level to a logic high level as shown by the waveform 1063, and when the ramp voltage reaches the intermediate voltage (e.g., Vb) as shown by the waveform 1065, the logic signal 963 (e.g., Tch) changes from the logic high level to the logic low level as shown by the waveform 1063. For example, when the ramp voltage ramps up from the predetermined minimum voltage to the intermediate voltage (e.g., Vb), the logic signal 963 (e.g., Tch) remains at the logic high level. As an example, when the ramp voltage remains at the predetermined minimum voltage, the logic signal 963 (e.g., Tch) remains at the logic low level.

In some examples, the current-to-pulse-width converter 960 includes a resistor, which converts the input current 961 to the intermediate voltage as follows:

$$V_b = I_2 \times R_t \qquad \text{(Equation 12)}$$

where $V_b$ represents the intermediate voltage. Additionally, $I_2$ represents the input current 961, and $R_t$ represents the resistance of the resistor that converts the input current 961 to the intermediate voltage according to some embodiments.

In certain examples, the intermediate voltage is larger than or equal to the predetermined minimum voltage. For example, if the predetermined minimum voltage is equal to zero, the pulse width of the logic signal 963 (e.g., Tch) is determined as follows:

$$T_w = \frac{V_b}{\alpha} \qquad \text{(Equation 13)}$$

where $T_w$ represents the pulse width of the logic signal 963, $V_b$ represents the intermediate voltage, and α represents the slope at which the ramp voltage ramps up. As an example, the intermediate voltage is larger than or equal to the predetermined minimum voltage and the slope at which the ramp voltage ramps up is larger than zero, so the pulse width of the logic signal 963 is larger than or equal to zero.

Figure 11:
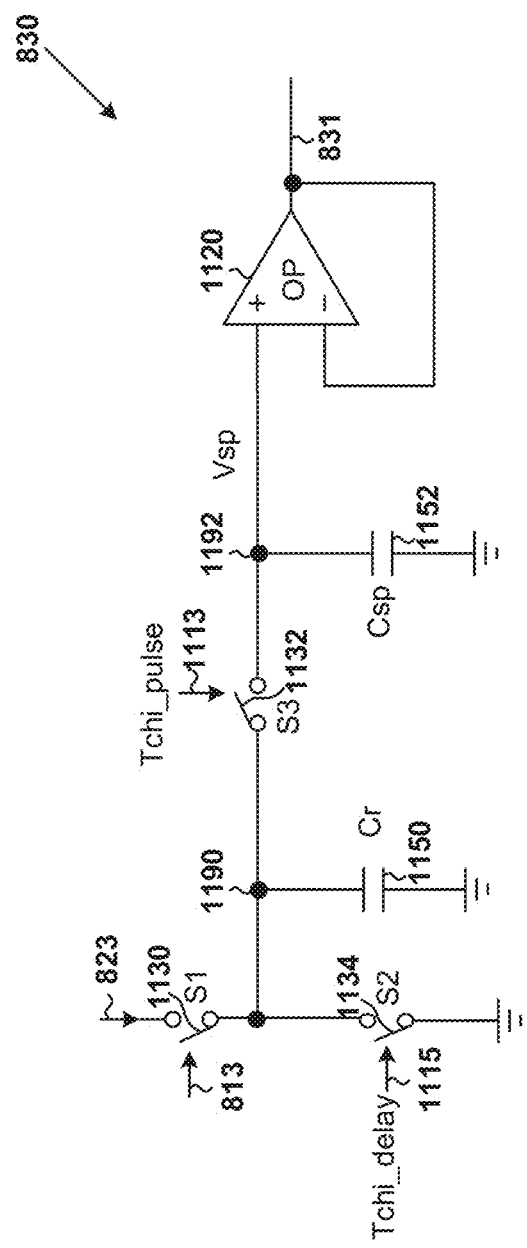
FIG. 11 is a simplified diagram showing the voltage adjustment and sampling circuit as part of the power detector as shown in FIG. 8 according to certain embodiments of the present invention.

FIG. 11 is a simplified diagram showing the voltage adjustment and sampling circuit 830 as part of the power detector 800 as shown in FIG. 8 according to certain embodiments of the present invention. This diagram is merely an example, which should not unduly limit the scope of the claims. One of ordinary skill in the art would recognize many variations, alternatives, and modifications. As shown in FIG. 11, the voltage adjustment and sampling circuit 830 includes an operational amplifier 1120, switches 1130, 1132, and 1134, capacitors 1150 and 1152. For example, the voltage adjustment and sampling circuit 830 is the voltage adjustment and sampling circuit 930. As an example, the voltage adjustment and sampling circuit 830 is the voltage adjustment and sampling circuit 980. Although the above has been shown using a selected group of components for the voltage adjustment and sampling circuit 830, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

According to some embodiments, the switch 1130 is controlled by the logic signal 813, the switch 1132 is controlled by a logic signal 1113, and the switch 1134 is controlled by a logic signal 1115. For example, when the logic signal 813 is at a logic high level, the logic signals 1113 and 1115 both are at a logic low level during the entire pulse width of the logic signal 813. As an example, when the logic signal 813 is at the logic low level, the logic signal 1113 is at the logic high level and the logic signal 1115 is at the logic low level during the first half of the off time of the logic signal 813, and the logic signal 1113 is at the logic low level and the logic signal 1115 is at the logic high level during the second half of the off time of the logic signal 813. In certain examples, if the logic signal 813 is at the logic high level, the switch 1130 is closed, and if the logic signal 813 is at the logic low level, the switch 1130 is open. In some examples, if the logic signal 1113 is at the logic high level, the switch 1132 is closed, and if the logic signal 1113 is at the logic low level, the switch 1132 is open. In certain examples, if the logic signal 1115 is at the logic high level, the switch 1134 is closed, and if the logic signal 1115 is at the logic low level, the switch 1134 is open.

Figure 12:
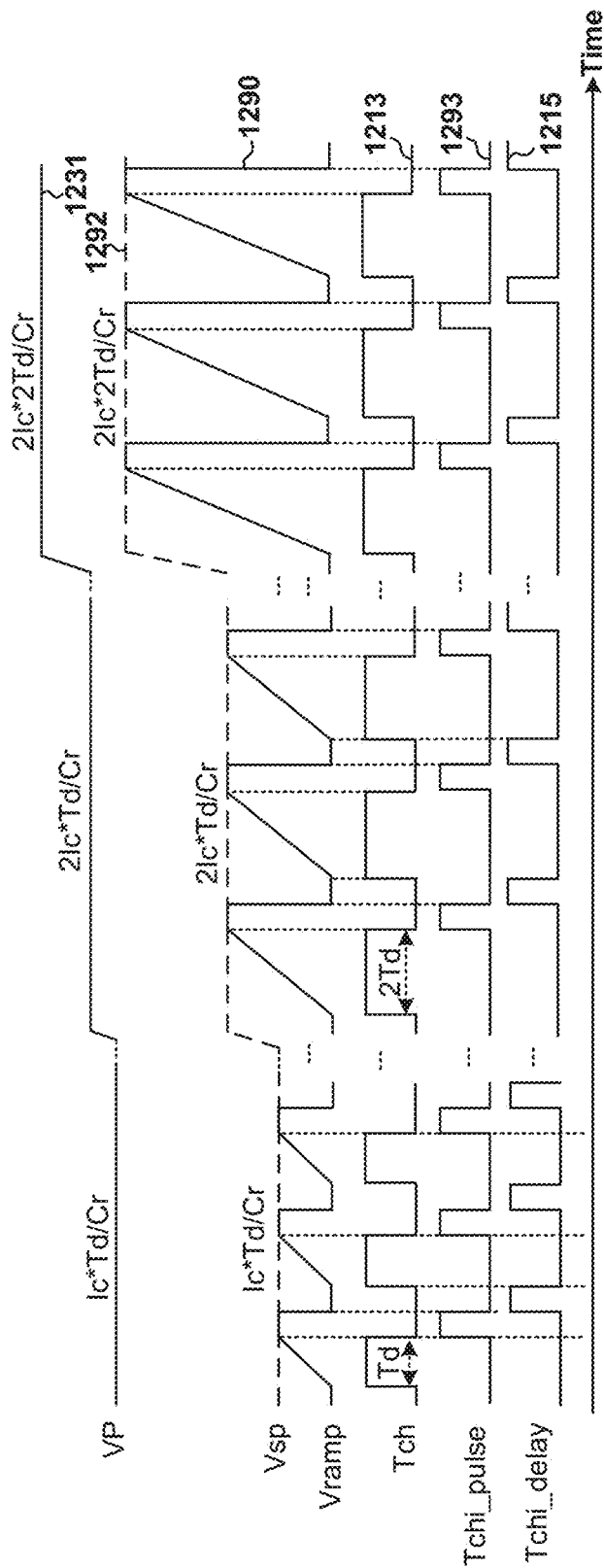
FIG. 12 shows simplified timing diagrams for the voltage adjustment and sampling circuit as part of the power detector as shown in FIG. 8 and FIG. 11 according to certain embodiments of the present invention.

FIG. 12 shows simplified timing diagrams for the voltage adjustment and sampling circuit 830 as part of the power detector 800 as shown in FIG. 8 and FIG. 11 according to certain embodiments of the present invention. These diagrams are merely examples, which should not unduly limit the scope of the claims. One of ordinary skill in the art would recognize many variations, alternatives, and modifications. The waveform 1231 represents the power detection signal 831 as a function of time, the waveform 1292 represents the voltage 1192 as a function of time, the waveform 1290 represents the voltage 1190 as a function of time, the waveform 1213 represents the logic signal 813 as a function of time, the waveform 1293 represents the logic signal 1113 as a function of time, and the waveform 1215 represents the logic signal 1115 as a function of time.

According to some embodiments, at the beginning of a charging/discharging period, if the switch 1130 becomes closed, the switch 1132 is open and the switch 1134 is also open. For example, when the switch 1130 is closed and the switches 1132 and 1134 are open, the current signal 823 flows through the switch 1130 and charges the capacitor 1150, causing the voltage 1190 to increase linearly with time from zero to its peak magnitude. In some examples, if the switch 1130 becomes open, the switch 1132 becomes closed and the switch 1134 remains open. For example, when the switch 1132 is closed and the switches 1130 and 1134 are open, the capacitor 1152 is charged by the charges provided by the capacitor 1150, causing a voltage 1192 to increase. In certain examples, if the switch 1132 becomes open, the switch 1134 becomes closed and the switch 1130 remains open. For example, when the switch 1134 is closed and the switches 1130 and 1132 are open, the capacitor 1150 is discharged, causing the voltage 1190 to drop to zero. In some embodiments, at the beginning of a next charging/discharging period, the switch 1130 again becomes closed, the switch 1132 remains open, and the switch 1134 becomes open. For example, after many charging/discharging periods, the voltage 1192 becomes approximately equal to the peak magnitude of the voltage 1190. As an example, the power detection signal 831 equals the voltage 1192.

In certain embodiments, the power detection signal 831 changes linearly with the pulse width of the logic signal 813 if the current signal 823 remains unchanged. For example, if the current signal 823 remains unchanged, the power detection signal 831 increases linearly with the increasing pulse width of the logic signal 813. As an example, if the current signal 823 remains unchanged, the power detection signal 831 decreases linearly with the decreasing pulse width of the logic signal 813.

In some embodiments, the power detection signal 831 changes linearly with the magnitude of the current signal 823 if the pulse width of the logic signal 813 remains unchanged. For example, if the pulse width of the logic signal 813 remains unchanged, the power detection signal 831 increases linearly with the increasing magnitude of the current signal 823. As an example, if the pulse width of the logic signal 813 remains unchanged, the power detection signal 831 decreases linearly with the decreasing magnitude of the current signal 823.

According to certain embodiments, the power detection signal 831 is determined as follows:

$$V_P = \frac{I_c \times T_w}{C_r} \quad \text{(Equation 14)}$$

where $V_P$ represents the power detection signal 831. Additionally, $V_c$ represents the current signal 823, $T_w$ represents the pulse width of the logic signal 813, and Cr represents the capacitance of the capacitor 1150 (e.g., a predetermined constant). For example, the pulse width $T_w$ of the logic signal 813 is equal to $T_d$ as shown in FIG. 12. As an example, the pulse width $T_w$ of the logic signal 813 is equal to $2 \times T_d$ as shown in FIG. 12.

In some examples, as shown in FIG. 9A, the input signal 811 is the input voltage 911 (e.g., V2) and the input signal 821 is the input current 921 (e.g., I2). For example, combining Equation 14 with Equation 9 and Equation 11, the following is obtained:

$$V_P = \frac{\beta \times I_2 \times V_2}{\alpha \times C_r} = \frac{\beta}{\alpha \times C_r} \times (I_2 \times V_2) = \frac{\beta}{\alpha \times C_r} \times P_2 \quad \text{(Equation 15)}$$

where $V_P$ represents the power detection signal 831, and $P_2$ represents the input power. As an example, as shown by Equation 15, the power detection signal 831 linearly changes with the input power.

In certain examples, as shown in FIG. 9B, the input signal 811 is the input current 961 (e.g., I2) and the input signal 821 is the input voltage 971 (e.g., V2). For example, combining Equation 14 with Equation 10, Equation 12 and Equation 13, the following is obtained:

$$V_P = \frac{V_2 \times I_2 \times R_t}{R_s \times \alpha} = \frac{R_t}{R_s \times \alpha} \times (I_2 \times V_2) = \frac{R_t}{R_s \times \alpha} \times P_2 \quad \text{(Equation 16)}$$

where $V_P$ represents the power detection signal 831, and $P_2$ represents the input power. As an example, as shown by Equation 16, the power detection signal 831 linearly changes with the input power.

Figure 13:
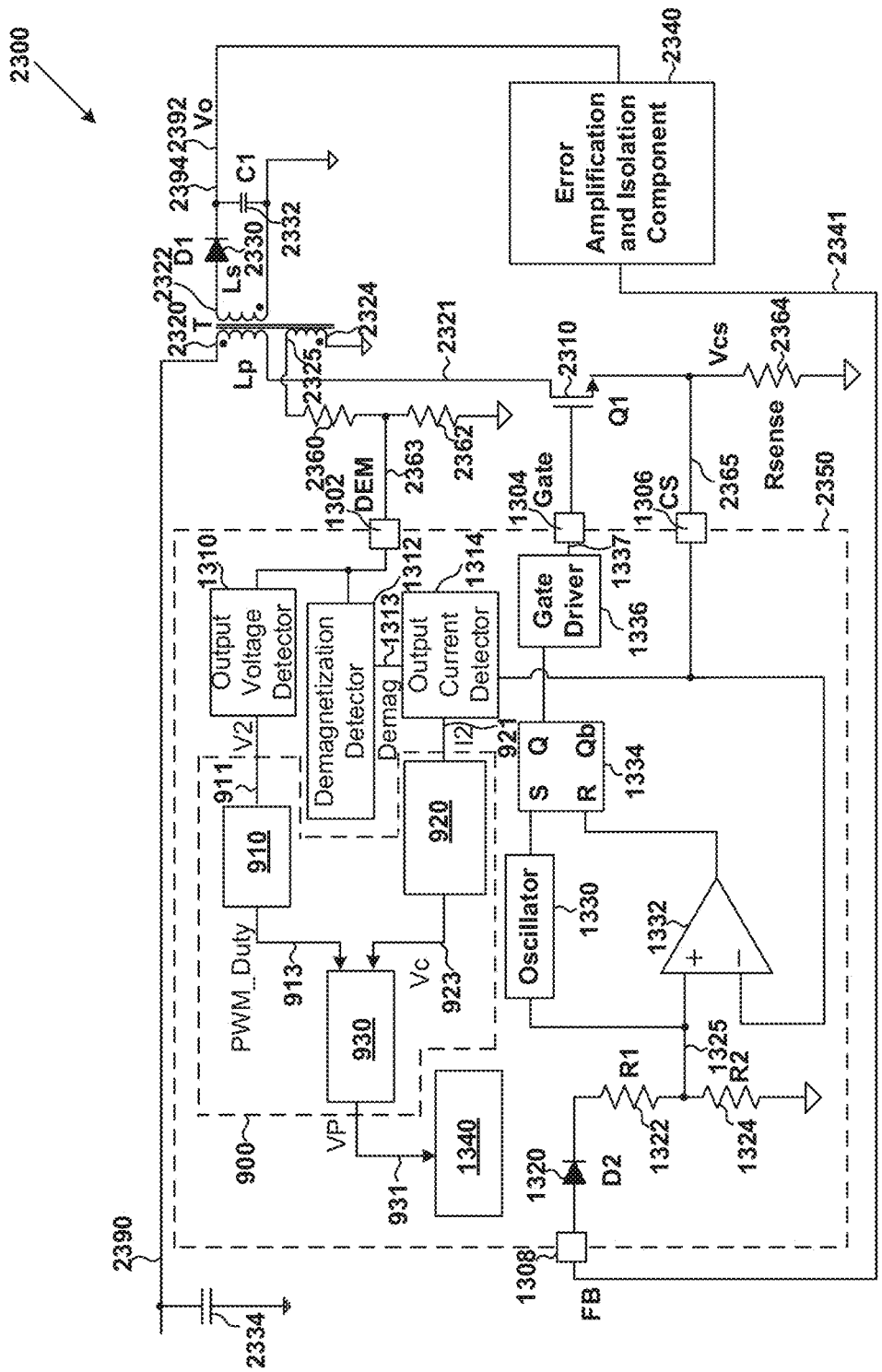
FIG. 13 is a simplified diagram showing certain components of a flyback power converter that includes the power detector as shown in FIG. 9A according to certain embodiments of the present invention.

FIG. 13 is a simplified diagram showing certain components of a flyback power converter that includes the power detector 900 as shown in FIG. 9A according to certain embodiments of the present invention. This diagram is merely an example, which should not unduly limit the scope of the claims. One of ordinary skill in the art would recognize many variations, alternatives, and modifications. As shown in FIG. 13, the flyback power converter 2300 includes a transistor 2310, a primary winding 2320, a secondary winding 2322, an auxiliary winding 2324, a diode 2330, capacitors 2332 and 2334, an error amplification and isolation component 2340, a controller 2350, and resistors 2360, 2362 and 2364. For example, the controller 2350 includes terminals 1302, 1304, 1306 and 1308. As an example, the controller 2350 also includes an output voltage detector 1310, a demagnetization detector 1312, an output current detector 1314, a diode 1320, resistors 1322 and 1324, an oscillator 1330, a comparator 1332, a flip flop 1334, a gate driver 1336, and an output power comparison and compensation circuit 1340. For example, the controller 2350 further includes the power detector 900 that includes the voltage-to-pulse-width converter 910, the current-to-current converter 920, and the voltage adjustment and sampling circuit 930. Although the above has been shown using a selected group of components for the flyback power converter 2300, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 13, the flyback power converter 2300 provides an output voltage 2392 (e.g., Vo) and an output current 2394 (e.g., Io) and delivers an output power (e.g., Po) according to certain embodiments. For example, the output power (e.g., Po) of the flyback power converter 2300 equals the output voltage 2392 (e.g., Vo) multiplied by the output current 2394 (e.g., Io). In some examples, the gate driver 1336 of the controller 2350 generates a drive signal 1337 and outputs the drive signal 1337 to the transistor 2310 (e.g., Q1) through the terminal 1304 (e.g., Gate) in order to turn on and/or turn off the transistor 2310 (e.g., Q1). In certain examples, the auxiliary winding 2324 generates a voltage 2325, which is used by a voltage divider that includes the resistors 2360 and 2362 to generate a voltage 2363. For example, the voltage 2363 is received by the output voltage detector 1310 and the demagnetization detector 1312 through the terminal 1302 (e.g., DEM).

In some embodiments, if the transistor 2310 (e.g., Q1) is turned on by the drive signal 1337, the primary winding 2320 (e.g., Lp) is charged by a voltage 2390, the diode 2330 (e.g., D1) is reverse biased, and the capacitor 2332 (e.g., C1) provides the output voltage 2392 (e.g., Vo) and the output current 2394 (e.g., Io). In certain examples, if the transistor 2310 (e.g., Q1) is turned on, based at least in part on the output voltage 2392 (e.g., Vo), the error amplification and isolation component 2340 generates a feedback signal 2341. For example, the feedback signal 2341 is received by the terminal 1308 (e.g., FB) of the controller 2350 (e.g., a pulse-width-modulation controller). As an example, based at least in part on the feedback signal 2341, the controller 2350 (e.g., a pulse-width-modulation controller) uses at least a voltage divider that includes the resistor 1322 (e.g., R1) and the resistor 1324 (e.g., R2) to generate a signal 1325. In some examples, if the transistor 2310 (e.g., Q1) is turned on, a current 2321 flows through the primary winding 2320 (e.g., Lp), the transistor 2310 (e.g., Q1) and the resistor 2364 (e.g., Rsense) and generates a sensing voltage 2365 (e.g., Vcs), which is received by the terminal 1306 (e.g., CS) of the controller 2350 (e.g., a pulse-width-modulation controller). For example, the controller 2350 (e.g., a pulse-width-modulation controller) processes information associated with the signal 1325 and the sensing voltage 2365 (e.g., Vcs) and controls the frequency and/or the duty cycle of the drive signal 1337 in order to regulate the output voltage 2392 (e.g., Vo) at a constant value.

In certain embodiments, if the transistor 2310 (e.g., Q1) is turned off by the drive signal 1337, the secondary winding 2322 undergoes a demagnetization process, the diode 2330 (e.g., D1) is forward biased, and the secondary winding 2322 charges the capacitor 2332 (e.g., C1) and also provides the output voltage 2392 (e.g., Vo) and the output current 2394 (e.g., Io). For example, the demagnetization detector 1312 uses the voltage 2363 to generate a demagnetization signal 1313 (e.g., Demag), which indicates the beginning and the end of the demagnetization process. In some examples, if the transistor 2310 (e.g., Q1) is turned off, based at least in part on the voltage 2363, the output voltage detector 1310 generates the input voltage 911 (e.g., V2), which changes linearly with the output voltage 2392 (e.g., Vo) of the flyback power converter 2300. For example, if the output voltage 2392 (e.g., Vo) increases, the input voltage 911 (e.g., V2) increases linearly with the output voltage 2392 (e.g., Vo). As an example, if the output voltage 2392 (e.g., Vo) decreases, the input voltage 911 (e.g., V2) decreases linearly with the output voltage 2392 (e.g., Vo). In some examples, the demagnetization signal 1313 (e.g., Demag) is received by the output current detector 1314, which also receives the sensing voltage 2365 (e.g., Vcs) and generates the input current 921 (e.g., I2), wherein the input current 921 (e.g., I2) changes linearly with the output current 2394 (e.g., Io) of the flyback power converter 2300. For example, if the output current 2394 (e.g., Io) increases, the input current 921 (e.g., I2) increases linearly with the output current 2394 (e.g., Io). As an example, if the output current 2394 (e.g., Io) decreases, the input current 921 (e.g., I2) decreases linearly with the output current 2394 (e.g., Io). In some examples, the output current detector 1314 uses the sensing voltage 2365 (e.g., Vcs) to determine the average magnitude of the current 2321 when the transistor 2310 (e.g., Q1) is turned on, and uses the demagnetization signal 1313 (e.g., Demag) to determine the time duration for the demagnetization process when the transistor 2310 (e.g., Q1) is turned off. For example, based at least in part on the average magnitude of the current 2321 when the transistor 2310 (e.g., Q1) is turned on and the time duration for the demagnetization process when the transistor 2310 (e.g., Q1) is turned off, the output current detector 1314 performs an integral operation to generate the input current 921 (e.g., I2). As an example, the input current 921 (e.g., I2) changes linearly with the output current 2394 (e.g., Io) of the flyback power converter 2300.

As shown in FIG. 9A, the power detector 900 receives the input voltage 911 (e.g., V2) and the input current 921 (e.g., I2) and generates the power detection signal 931 based at least in part on the input voltage 911 (e.g., V2) and the input current 921 (e.g., I2) according to some embodiments. For example, the power detection signal 931 (e.g., VP) represents the input power that equals the input voltage 911 (e.g., V2) multiplied by the input current 921 (e.g., I2). In certain examples, the input voltage 911 (e.g., V2) changes linearly with the output voltage 2392 (e.g., Vo) of the flyback power converter 2300, and the input current 921 (e.g., I2) changes linearly with the output current 2394 (e.g., Io) of the flyback power converter 2300. For example, the output power (e.g., Po) of the flyback power converter 2300 equals the output voltage 2392 (e.g., Vo) multiplied by the output current 2394 (e.g., Io). As an example, the power detection signal 931 (e.g., VP) represents the output power (e.g., Po) of the flyback power converter 2300. In some examples, the power detection signal 931 (e.g., VP) changes linearly with the output power (e.g., Po) of the flyback power converter 2300. For example, the power detection signal 931 (e.g., VP) increases linearly with the increasing output power (e.g., Po) of the flyback power converter 2300. As an example, the power detection signal 931 (e.g., VP) decreases linearly with the decreasing output power (e.g., Po) of the flyback power converter 2300.

As shown in FIG. 13, the power detection signal 931 (e.g., VP) is received by the output power comparison and compensation circuit 1340 according to certain embodiments. For example, the output power comparison and compensation circuit 1340 uses the power detection signal 931 (e.g., VP) to perform constant output power regulation, over-power protection, and/or over-current protection. As an example, the output power comparison and compensation circuit 1340 uses the power detection signal 931 (e.g., VP) to support a wide range of the output voltage 2392 (e.g., Vo) and/or a wide range of the output power (e.g., Po) of the flyback power converter 2300.

Some embodiments of the present invention provide a power detector to generate a power detection signal by at least determining the product of a voltage signal and the duty cycle of a pulse-width-modulation signal according to, for example, Equation 6. Certain embodiments of the present invention provide a power detector to generate a power detection signal by at least determining the product of a current signal and the pulse width of a logic signal according to, for example, Equation 14.

Some embodiments of the present invention can more easily and accurately provide a power detection signal to one or more power comparison modules, one or more power conversion modules, and/or other circuit modules that perform performance compensation based at least in part on the power detection signal. Certain embodiments of the present invention can simplify circuit design, increase a linearity range of power detection, and/or improve stability of power detection.

According to certain embodiments, a system for detecting a power includes: a first signal converter configured to receive a first signal and generate a pulse-width-modulation signal based at least in part on the first signal; a second signal converter configured to receive a second signal and generate a voltage signal based at least in part on the second signal; and a low-pass filter configured to receive the pulse-width-modulation signal and the voltage signal and generate a power detection signal based at least in part on the pulse-width-modulation signal and the voltage signal; wherein: the first signal is either an input current or an input voltage, the second signal is either the input current or the input voltage; and the first signal and the second signal are different; wherein: the power detection signal represents an input power that is equal to the input current multiplied by the input voltage; and the power detection signal changes linearly with the input power in magnitude. For example, the system is implemented according to at least FIG. 2.

As an example, if the input power increases, the power detection signal increases linearly with the input power in magnitude; and if the input power decreases, the power detection signal decreases linearly with the input power in magnitude. For example, the first signal converter is further configured to change a duty cycle of the pulse-widthmodulation signal linearly with the first signal in magnitude; wherein: if the first signal increases in magnitude, the duty cycle increases linearly with the first signal; and if the first signal decreases in magnitude, the duty cycle decreases linearly with the first signal. As an example, the first signal converter is further configured to, even if the duty cycle changes, keep a frequency of the pulse-width-modulation signal constant.

For example, the second signal converter is further configured to change the voltage signal linearly with the second signal in magnitude; wherein: if the second signal increases in magnitude, the voltage signal increases with the second signal; and if the second signal decreases in magnitude, the voltage signal decreases with the second signal. As an example, if the first signal is the input voltage and the second signal is the input current, the first signal converter is a voltage-to-duty-cycle converter and the second signal converter is a current-to-voltage converter. For example, if the first signal is the input current and the second signal is the input voltage, the first signal converter is a current-to-duty-cycle converter and the second signal converter is a voltage-to-voltage converter.

As an example, the input current represents an output current of a power converter; and the input voltage represents an output voltage of the power converter; wherein: the input current changes linearly with the output current of the power converter; and the input voltage changes linearly with the output voltage of the power converter. For example, the power detection signal represents an output power of the power converter, the output power being equal to the output current multiplied by the output voltage; and the power detection signal changes linearly with the output power of the power converter in magnitude.

According to some embodiments, a system for detecting a power includes: a first signal converter configured to receive a first signal and generate a logic signal based at least in part on the first signal; a second signal converter configured to receive a second signal and generate a current signal based at least in part on the second signal; and a signal generator configured to receive the logic signal and the current signal and generate a power detection signal based at least in part on the logic signal and the current signal; wherein: the first signal is either an input current or an input voltage; the second signal is either the input current or the input voltage; and the first signal and the second signal are different; wherein: the power detection signal represents an input power that is equal to the input current multiplied by the input voltage; and the power detection signal changes linearly with the input power in magnitude. For example, the system is implemented according to at least FIG. 8.

As an example, if the input power increases, the power detection signal increases linearly with the input power in magnitude; and if the input power decreases, the power detection signal decreases linearly with the input power in magnitude. For example, the first signal converter is further configured to change a pulse width of the logic signal linearly with the first signal in magnitude; wherein: if the first signal increases in magnitude, the pulse width increases linearly with the first signal; and if the first signal decreases in magnitude, the pulse width decreases linearly with the first signal. As an example, the logic signal changes between a logic high level and a logic low level; the pulse width represents a time duration when the logic signal is at the logic high level; and an off time represents a time duration when the logic signal is at the logic low level. For example, the first signal converter is further configured to, even if the pulse width changes, keep the off time of the logic signal constant.

As an example, the second signal converter is further configured to change the current signal linearly with the second signal in magnitude; wherein: if the second signal increases in magnitude, the current signal increases with the second signal; and if the second signal decreases in magnitude, the current signal decreases with the second signal. For example, if the first signal is the input voltage and the second signal is the input current, the first signal converter is a voltage-to-pulse-width converter and the second signal converter is a current-to-current converter. As an example, if the first signal is the input current and the second signal is the input voltage, the first signal converter is a current-to-pulse-width converter and the second signal converter is a voltage-to-current converter.

For example, the input current represents an output current of a power converter; and the input voltage represents an output voltage of the power converter; wherein: the input current changes linearly with the output current of the power converter; and the input voltage changes linearly with the output voltage of the power converter. As an example, the power detection signal represents an output power of the power converter, the output power being equal to the output current multiplied by the output voltage; and the power detection signal changes linearly with the output power of the power converter in magnitude.

According to certain embodiments, a method for detecting a power includes: receiving a first signal; generating a pulse-width-modulation signal based at least in part on the first signal; receiving a second signal; generating a voltage signal based at least in part on the second signal; receiving the pulse-width-modulation signal and the voltage signal; and generating a power detection signal based at least in part on the pulse-width-modulation signal and the voltage signal, the power detection signal being equal to the voltage signal multiplied by a duty cycle of the pulse-width-modulation signal; wherein: the first signal is either an input current or an input voltage; the second signal is either the input current or the input voltage; and the first signal and the second signal are different; wherein: the power detection signal represents an input power that is equal to the input current multiplied by the input voltage; and the power detection signal changes linearly with the input power in magnitude. For example, the method is implemented according to at least FIG. 2 and/or FIG. 5.

According to some embodiments, a method for detecting a power includes: receiving a first signal; generating a logic signal based at least in part on the first signal; receiving a second signal; and generating a current signal based at least in part on the second signal; receiving the logic signal and the current signal; and generating a power detection signal based at least in part on the logic signal and the current signal, the power detection signal being equal to the current signal multiplied by a pulse width of the logic signal and also multiplied by a predetermined constant; wherein: the first signal is either an input current or an input voltage; the second signal is either the input current or the input voltage; and the first signal and the second signal are different; wherein: the power detection signal represents an input power that is equal to the input current multiplied by the input voltage; and the power detection signal changes linearly with the input power in magnitude. For example, the method is implemented according to at least FIG. 8 and/or FIG. 11.

For example, some or all components of various embodiments of the present invention each are, individually and/or in combination with at least another component, implemented using one or more software components, one or more hardware components, and/or one or more combinations of software and hardware components. As an example, some or all components of various embodiments of the present invention each are, individually and/or in combination with at least another component, implemented in one or more circuits, such as one or more analog circuits and/or one or more digital circuits. For example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments.

What is claimed is:

1. A system for detecting a power, the system comprising:
   a first signal converter configured to receive a first signal and generate a pulse-width-modulation signal based at least in part on the first signal;
   a second signal converter configured to receive a second signal and generate a voltage signal based at least in part on the second signal; and
   a low-pass filter configured to receive the pulse-width-modulation signal and the voltage signal and generate a power detection signal based at least in part on the pulse-width-modulation signal and the voltage signal;
   wherein:
     the first signal is either an input current or an input voltage;
     the second signal is either the input current or the input voltage; and
     the first signal and the second signal are different;
   Wherein:
     the power detection signal represents an input power that is equal to the input current multiplied by the input voltage; and
     the power detection signal changes linearly with the input power in magnitude.

2. The system of claim 1 wherein:
   if the input power increases, the power detection signal increases linearly with the input power in magnitude; and
   if the input power decreases, the power detection signal decreases linearly with the input power in magnitude.

3. The system of claim 1 wherein:
   the first signal converter is further configured to change a duly cycle of the pulse-width-modulation signal linearly with the first signal in magnitude;
   wherein:
     if the first signal increases in magnitude, the duty cycle increases linearly with the first signal; and
     if the first signal decreases in magnitude, the duty cycle decreases linearly with the first signal.

4. The system of claim 3 wherein the first signal converter is further configured to, even if the cycle changes, keep a frequency of the pulse-width-modulation signal constant.

5. The system of claim 1 wherein:
   the second signal converter is further configured to change the voltage signal linearly with the second signal in magnitude;
   wherein:
     if the second signal increases in magnitude, the voltage signal increases with the second signal; and
     if the second signal decreases in magnitude, the voltage signal decreases with the second signal.

6. The system of claim 1 wherein, if the first signal is the input voltage and the second signal is the input current, the first signal converter is a voltage-to-duty-cycle converter and the second signal converter is a current-to-voltage converter.

7. The system of claim 1 wherein, if the first signal is the input current and the second signal is the input voltage, the first signal converter is a current-to-duty-cycle converter and the second signal converter is a voltage-to-voltage converter.

8. The system of claim 1 wherein:
   the input current represents an output current of a power converter; and
   the input voltage represents an output voltage of the power converter;
   wherein:
     the input current changes linearly with the output current of the power converter; and
     the input voltage charges linearly with the output voltage of the power converter.

9. The system of claim 8 wherein:
   the power detection signal represents an output power of the power converter, the output power being equal to the output current multiplied by the output voltage; and
   the power detection signal changes linearly the output power of the power converter in magnitude.

10. A system for detecting a power, the system comprising:
    a first signal converter configured to receive a first signal and generate a logic signal based at least in part on the first signal;
    a second signal converter configured to receive a second signal and generate a current signal based at least in part on the second signal; and
    a signal generator configured to receive the logic signal and the current signal and generate a power detection signal based at least in part on the logic signal and the current signal;
    wherein:
      the first signal is either an input current or an input voltage;
      the second signal is either the input current or the input voltage; and
      the first signal and the second signal are different;
    wherein:
      the power detection signal represents an input power that is equal to the input current multiplied by the input voltage; and
      the power detection signal changes linearly with the input power in magnitude.

11. The system of claim 10 wherein:
    if the input power increases, the power detection signal increases linearly with the input power in magnitude; and
    if the input power decreases, the power detection signal decreases linearly with the input power in magnitude.

12. The system of claim 10 wherein:
    the first signal converter is further configured to change a pulse width of the logic signal linearly with the first signal in magnitude;
    wherein:
      if the first signal increases in magnitude, the pulse width increases linearly with the first signal; and
      if the first signal decreases in magnitude, the pulse width decreases linearly with the first signal.

13. The system of claim 12 wherein:
the logic signal changes between a logic high level and a logic low level;
the pulse width represents a time duration when the logic signal is at the logic high level; and
an off time represents a time duration when the logic signal is at the logic low level.

14. The system of claim 13 wherein:
the first signal converter is further configured to, even if the pulse width changes, keep the off time of the logic signal constant.

15. The system of claim 10 wherein:
the second signal converter is further configured to change the current signal linearly with the second signal in magnitude;
wherein:
if the second signal increases in magnitude, the current signal increases with the second signal; and
if the second signal decreases in magnitude, the current signal decreases with the second signal.

16. The system of claim 10 wherein, if the first signal is the input voltage and the second signal is the input current, the first signal converter is a voltage-to-pulse-width converter and the second signal converter is a current-to-current converter.

17. The system of claim 10 wherein, if the first signal is the input current and the second signal is the input voltage, the first signal converter is a current-to-pulse-width converter and the second signal converter is a voltage-to-current converter.

18. The system of claim 10 wherein:
the input current represents an output current of a power converter; and
the input voltage represents an output voltage of the power converter;
wherein:
the input current changes linearly with the output current of the converter; and
the input voltage changes linearly with the output voltage of the power converter.

19. The system of claim 18 wherein:
the power detection signal represents an output power of the power converter, the output power being equal to the output current multiplied by the output voltage; and
the power detection signal changes linearly with the output power of the power converter in magnitude.

20. A method for detective a power, the method comprising:
receiving a first signal;
generating a pulse-width-modulation signal based at least in part on the first signal;
receiving a second signal;
generating a voltage signal based at least in part on the second signal;
receiving the pulse-width-modulation signal and the voltage signal; and
generating a power detection signal based at least in part on the pulse-width-modulation signal and the voltage signal, the power detection signal being equal to the voltage signal multiplied by a duty cycle of the pulse-width-modulation signal;
wherein:
the first signal is either an input current or an input voltage;
the second signal is either the input current or the input voltage; and
the first signal and the second signal are different;
wherein:
the power detection signal represents an input power that is equal to the input current multiplied by the input voltage; and
the power detection signal changes linearly with the input power in magnitude.

21. A method for detecting a power, the method comprising:
receiving a first signal;
generating a logic signal based at least in part on the first signal;
receiving a second signal;
generating a current signal based at least in part on the second signal;
receiving the logic signal and the current signal; and
generating a power detection signal based at least in part on the logic signal and the current signal, the power detection signal being equal to the current signal multiplied by a pulse width of the logic signal and also multiplied by a predetermined constant;
wherein:
the first signal is either an input current or an input voltage;
the second signal is either the input current or the input voltage; and
the first signal and the second signal are different;
wherein:
the power detection signal represents an input power that is equal to the input current multiplied by the input voltage; and
the power detection signal changes linearly with the input power in magnitude.

* * * * *